United States Patent [19]
Katayama et al.

[11] Patent Number: 5,162,724
[45] Date of Patent: Nov. 10, 1992

[54] SPECTRUM ANALYZER CAPABLE OF DISPLAYING SIGNALS OBTAINED DURING A SPECIFIED PERIOD BY MEANS OF CONTINUOUS SWEEP

[75] Inventors: Aiichi Katayama, Isehara; Mitsuyoshi Takano, Machida; Hiroyoshi Oka, Atugi; Kenichi Kon, Machida, all of Japan

[73] Assignee: Anritsu Corporation, Tokyo, Japan

[21] Appl. No.: 410,643

[22] Filed: Sep. 21, 1989

[30] Foreign Application Priority Data

Sep. 26, 1988 [JP] Japan .................. 63-240530
Sep. 7, 1989 [JP] Japan .................. 1-230515

[51] Int. Cl.$^5$ .................. G01R 23/16; G01R 23/00
[52] U.S. Cl. .................. 324/77 B; 324/78 D; 364/485
[58] Field of Search ............. 73/77 B, 77 C, 77 CS, 73/78 D, 79 R; 364/485, 486, 487

[56] References Cited

U.S. PATENT DOCUMENTS

| | | | |
|---|---|---|---|
| 4,611,165 | 9/1986 | Nussbaum | 324/77 B |
| 4,839,582 | 6/1989 | Fukaya et al. | 324/77 B |
| 4,890,099 | 12/1989 | Takano | 324/77 B |
| 5,038,096 | 8/1991 | Obie et al. | 324/77 B |

FOREIGN PATENT DOCUMENTS

| | | |
|---|---|---|
| 53-15858 | 2/1978 | Japan . |
| 58-68677 | 4/1983 | Japan . |
| 58-113866 | 7/1983 | Japan . |
| 59-92863 | 6/1984 | Japan . |
| 62-189669 | 12/1987 | Japan . |
| 63-132178 | 6/1988 | Japan . |

OTHER PUBLICATIONS

Anritsu's New Frequency Counters Speed Up High Frequency Measurements, JEE, Apr. 1980, pp. 68–71.
French: Utilisation de l'analyseur de spectre en mode dechenche; TLE, Jan. 1984, No. 490, pp. 34–37.

Primary Examiner—Louis Arana

[57] ABSTRACT

A spectrum analyzer comprising various components. In the analyzer, a high-frequency signal processing circuit frequency-converts an object signal including waves recurring for a short period of time, into an intermediate-frequency signal, by using a local oscillation signal swept continuously over a desired range of frequencies, and thereby outputs a frequency spectrum of the object signal. A demodulator demodulates the frequency spectrum output by the high-frequency signal processing circuit. A selection signal supplying section supplies a selection signal for selecting that portion of the spectrum output by the demodulator, which lies waves to be analyzed. A control section outputs said portion of the spectrum output by the demodulator, in accordance with the selection signal output from the selection signal supplying section. A display displays the frequency spectrum output by the control section. A sweep control section causes the high-frequency signal processing circuit to sweep the local oscillation signal repeatedly, each time for a period which is not an integral multiple of the cycle period of the selection signal.

6 Claims, 20 Drawing Sheets

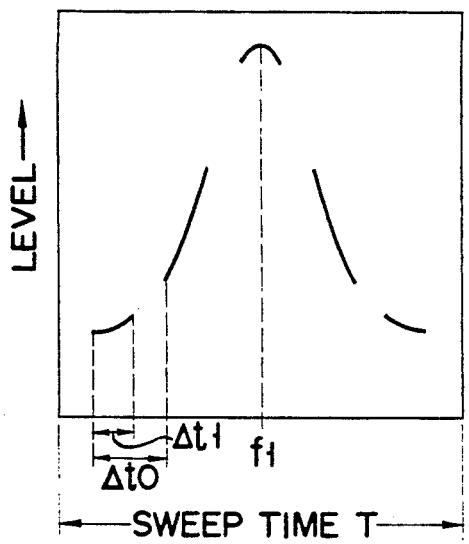
F I G. 3A
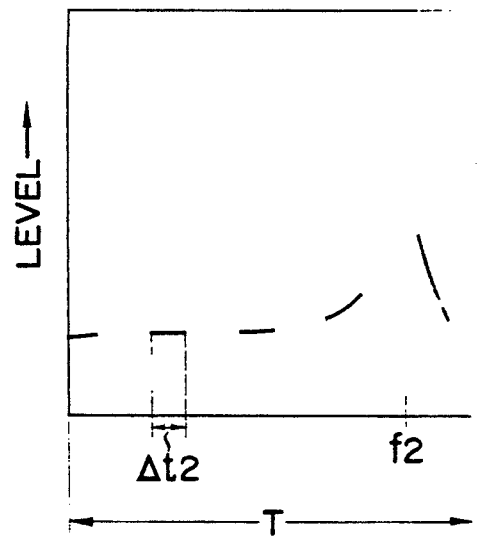
F I G. 3B
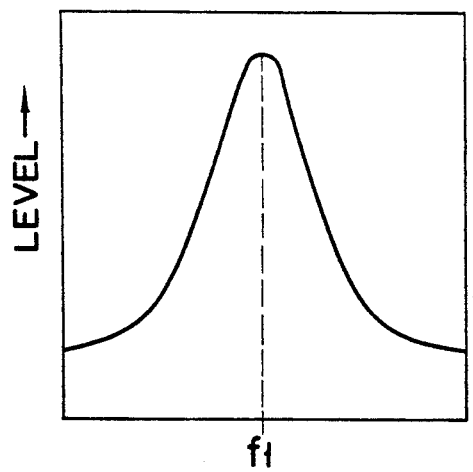
F I G. 4A
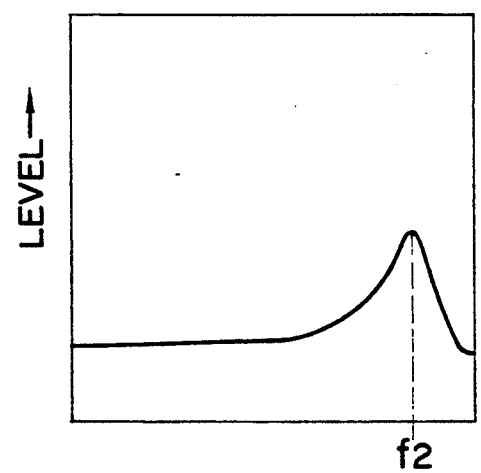
F I G. 4B

| EFFECTIVE DATA SELECTING SIGNAL | PREVIOUS FLAG | NEW FLAG | DATA |
|---|---|---|---|
| "0" | × | × | NOT STORED |
| "0" | ○ | ○ | NOT UPDATED (HOLDING DATA) |
| "1" | × | ○ | NEWLY STORED |
| "1" | ○ | ○ | UPDATED |

| ADDRESS | FLAG | DATA | FREQUENCY (MHZ) |
|---|---|---|---|
| 0 | ○ | 70.65 | 100.0 |
| 1 | ○ | 67.87 | 102.5 |
| 2 | × | N | 105.0 |
| 3 | × | N | 107.5 |
| 4 | × | N | 110.0 |
| 5 | ○ | 72.43 | 112.5 |
| 6 | × | N | 115.0 |
| 7 | ○ | 71.65 | 117.5 |
| 8 | ○ | 63.27 | 120.0 |
| 9 | ○ | 52.94 | 122.5 |
| 10 | × | N | 125.0 |
| 11 | × | N | 127.5 |
| 12 | ○ | 37.68 | 130.0 |
| 13 | ○ | 41.27 | 132.5 |
| 14 | ○ | 36.55 | 135.0 |
| 15 | × | N | 137.5 |
| 16 | ○ | 49.23 | 140.0 |
| 17 | ○ | 56.97 | 142.5 |
| : | : | : | : |
| : | : | : | : |
| : | : | : | : |
| | | | |
| | | | |
| | | | |

(N: LOWEST LEVEL DETECTED)

FIG. 11

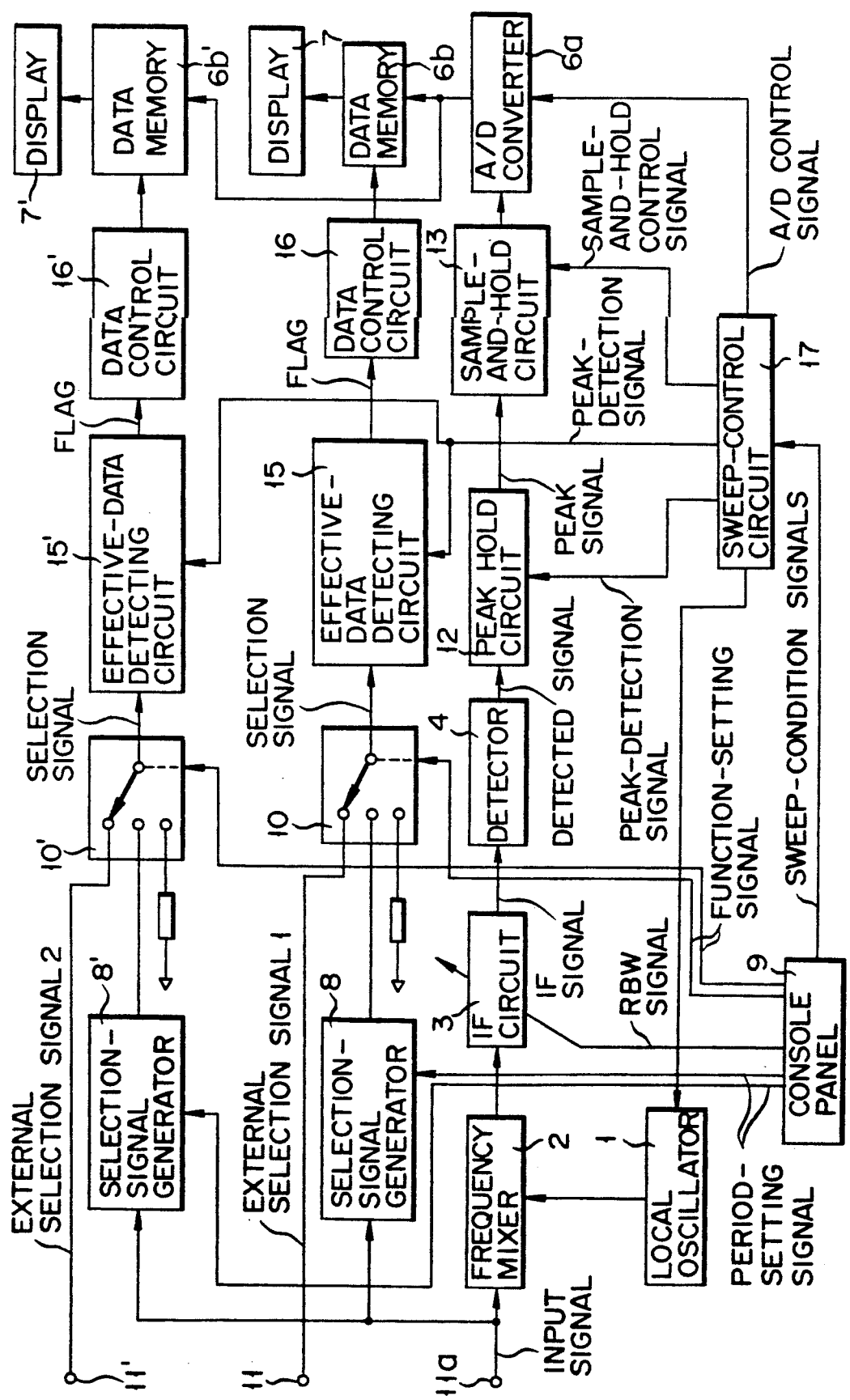
F I G. 17

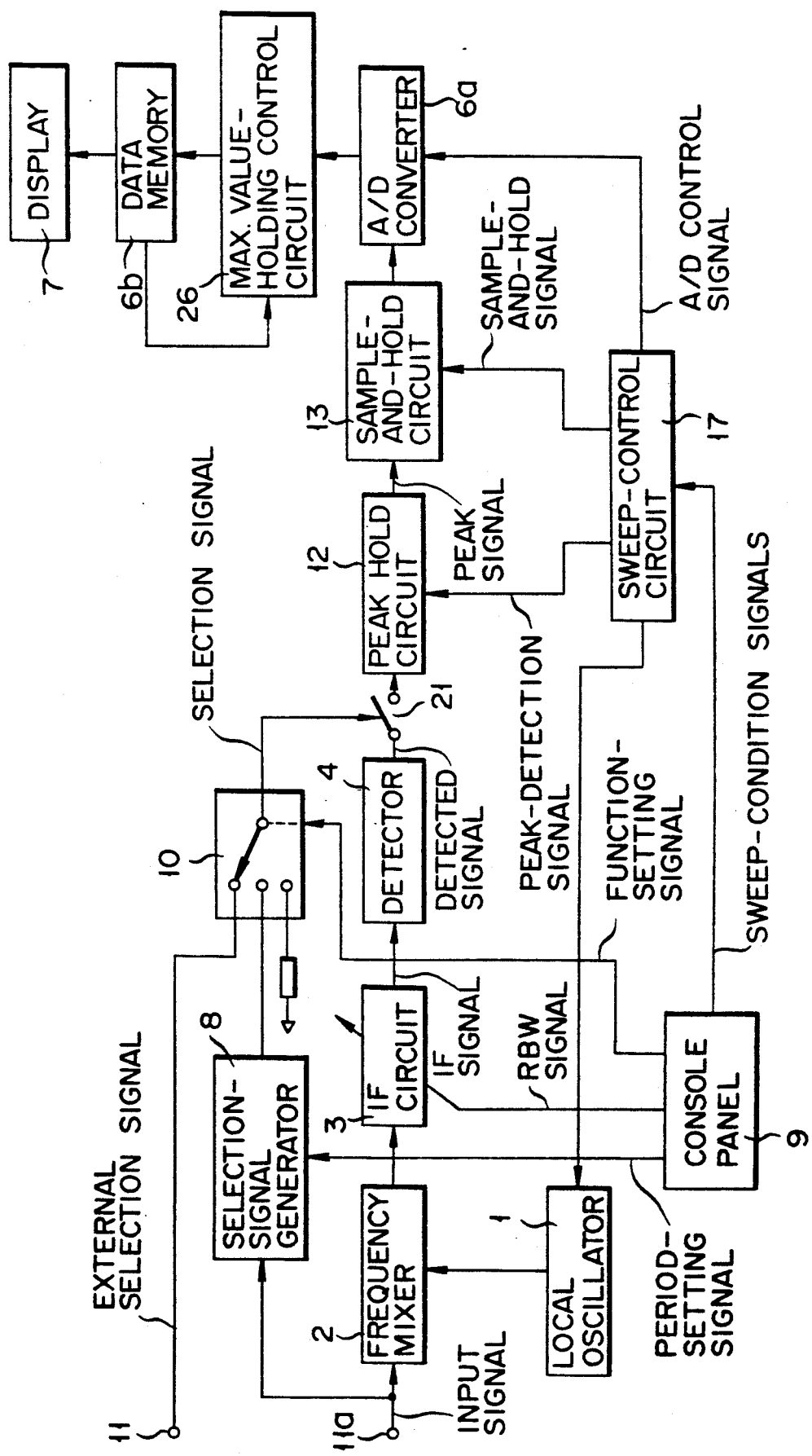
F I G. 18

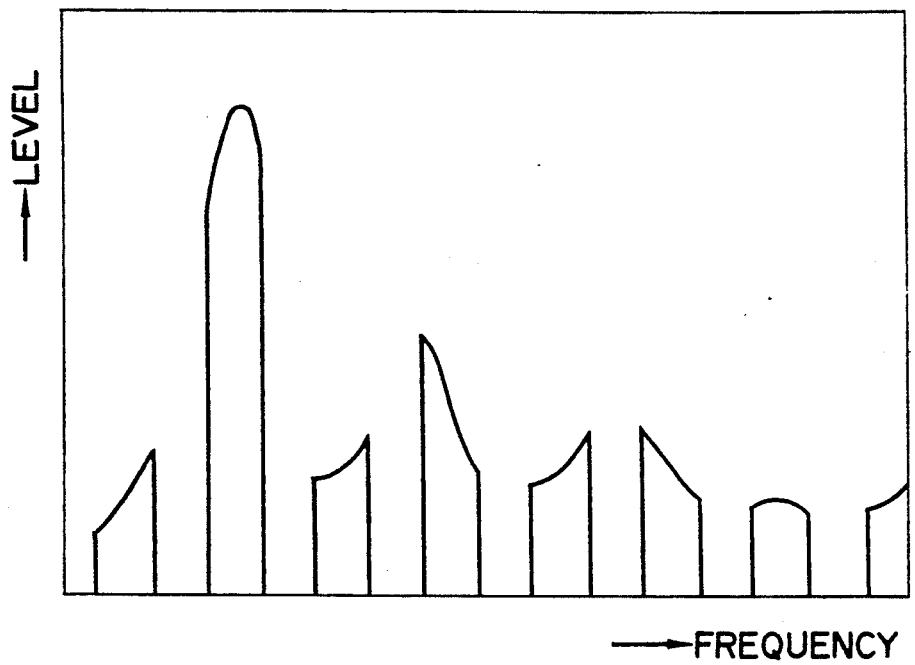
F I G. 19
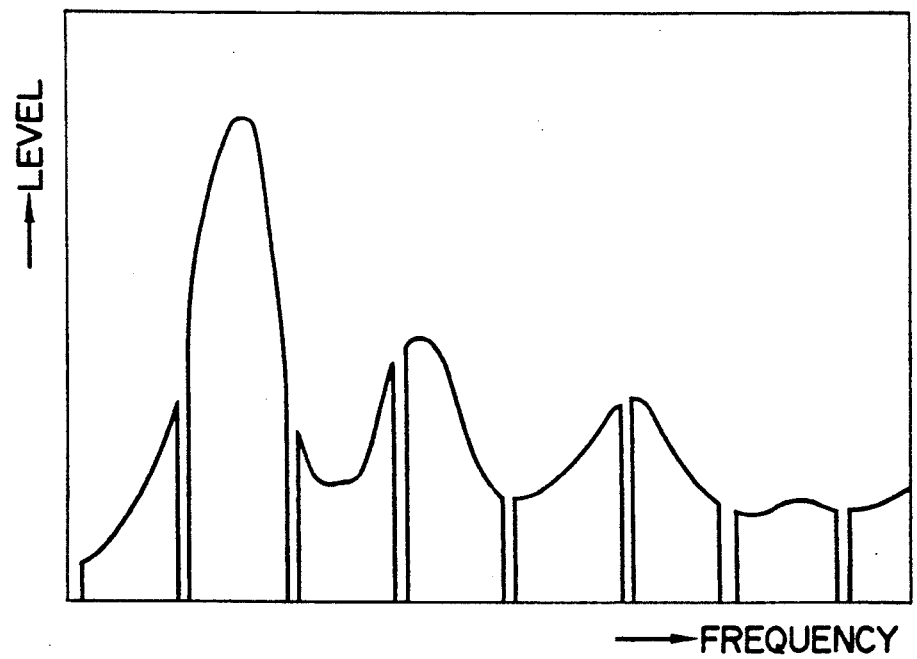
F I G. 20

SPECTRUM ANALYZER CAPABLE OF DISPLAYING SIGNALS OBTAINED DURING A SPECIFIED PERIOD BY MEANS OF CONTINUOUS SWEEP

BACKGROUND OF THE INVENTION

1. Field of the Invention

The present invention generally relates to a spectrum analyzer and, more particularly, to a spectrum analyzer which can easily detect the frequency spectrum of a BURST (where BURST means a signal having an envelope amplitude-modulated by signal such as a pulse like signal) signal by means of continuous frequency-sweep of the BURST signal.

2. Description of the Related Art

Most conventional spectrum analyzers are designed to analyze an input signal which last longer than its sweep time. Therefore, they cannot be applied to the analysis of BURST signals which last only for a short period of time.

Published Unexamined Japanese Patent Application No. 62-189669 discloses a spectrum analyzer designed to analyze burst signals. This spectrum analyzer performs frequency sweep of a burst signal input to it, measures the frequency spectrum of the burst signal, stores the data representing the frequency spectrum into a memory, reads the data, when necessary, and displays the frequency spectrum of the burst signal. This spectrum analyzer, known as "digital-storage spectrum analyzer (DSSA)," performs frequency sweep for every period the burst signal contains a high-frequency component and does not perform the sweep for every period the signal contains no high-frequency components. The period during which the burst signal has a high-frequency component, and the period during which the signal has no high-frequency components are far shorter than the period during which the spectrum analyzer analyzes long-lasting signals. The conditions in the analyzer remain the same, regardless of whether or not the frequency sweep is carried out.

The local oscillator incorporated in the DSSA is driven for every period the burst signal contains a high-frequency component, and not driven for every period the signal contains no high-frequency components. The detector, also incorporated in this analyzer, detects the burst signal for every period the signal contains a high-frequency component, and holds the detected data for every period the signal contains no high-frequency components.

The conventional DSSA is disadvantageous in the following respects:

(i) The performance stability of the local oscillator, and the sweep voltage and the like which control the local oscillator affect the accuracy of measuring the frequency (or frequency axis) of the signal. The accuracy of measuring the frequency greatly decreases with time. Due to the recurring periods during which the burst signal contains no high-frequency components, the accuracy of measuring is considerably low. Further, the higher the sweep speed, the more excessively the local oscillator will respond to the changes in the sweep voltage. (The sweep speed is either the ratio of the change in the sweep voltage to the sweep time, or the ratio of change in the sweep frequency to the sweep time, and the sweep speed changes every time the frequency sweep is started or stopped.)

(ii) It is necessary to generate a sweep voltage having a waveform appropriate for performing the frequency sweep during every period the burst signal contains a high-frequency component and for not performing the frequency sweep during every period the burst signal contains no high-frequency components.

(iii) Of the conditions for measuring the frequency of the burst signal, at least the resolution band width, the range of sweep frequency, and the sweep time must be displayed to the operator, because these conditions influence the accuracy of measuring. However, a correct sweep time cannot be displayed since, during what is referred to as "sweep time" in the prior art, there are in fact periods during which the sweep is not actually performed. The so-called sweep time includes the periods during which the frequency sweep is not actually carried out. The actual sweep time cannot be calculated and displayed, without a very complex circuit.

SUMMARY OF THE INVENTION

It is, therefore, an object of the present invention to provide a new and improved spectrum analyzer which can display signals obtained during a specified period by means of continuous sweep, and in which the local oscillator is not intermittently driven to reduce the efficiency of spectrum analysis, but is continuously driven, thus providing data about a whole burst signal or a similar signal, and ultimately detecting the spectrum of the signal.

In order to attain the above object, a spectrum analyzer according to the present invention continuously sweeps the entire waveform of a signal to be measured, thereby detecting the frequency spectrum of the signal, and then selects the desired part of the frequency spectrum.

The present invention can apply to not only a digital-storage spectrum analyzer (DSSA), but also an analog-storage spectrum analyzer (ASSA) which has a display such as a CRT and utilizes the afterglow of the display screen.

More specifically, the spectrum analyzer according to the invention comprises a high-frequency wave processing unit, a sweep control unit, a control unit, and a display unit. The high-frequency wave processing unit has a local oscillator, a frequency mixer, an IF circuit, and a detector. The sweep control unit supplies a sweep signal to the high-frequency wave processing unit. In response to the sweep signal, the high-frequency wave processing unit continuously sweeps the entire waveform of a signal to be measured such as a BURST signal. The control unit selects the desired part of the signal output from the detector, in accordance with a selection signal, and causes the display unit to display the frequency spectrum of the desired part of the signal. The selection signal used can be either a signal obtained by demodulating the signal to be measured by means of data-selecting means incorporated in the analyzer, or an appropriate signal generated along with the sample signal in an external signal source.

In an ASSA according to the present invention, the Z axis of the display unit (e.g., a CRT) is luminance-modulated in accordance with the selection signal, thereby to display the frequency spectrum of the desired part of the signal to be measured.

In a DSSA according to the present invention, the control unit comprises an A/D converter for converting the signal output from the high-frequency signal processing unit, into digital data, a data memory for storing the digital data, and a data control unit for controlling the A/D converter and the data memory. The data representing the frequency spectrum of that part of the signal to be measured which has been selected in accordance with the selection signal can be stored as an effective-data flag into the data memory, along with the digital data. Alternatively, the digital data representing the frequency spectrum of the entire signal to be measured can be stored into the data memory, along with an effective-data flag, and only that part of the digital data which corresponds to the effective-data flag can be read out from the memory and used as data representing the frequency spectrum of the desired part of the signal to be measured.

The DSSA according to the invention further comprises an effective-data detecting circuit for determining whether any data item obtained during any period of T/n (later described) included in the sweep time T is effective or not, in accordance with the selection signal and a peak-detecting signal (later described).

The present invention is so comprised because when the signal the high-frequency signal processing unit has detected during the sweep time T is sampled at n points, and the sampled data items are stored into the data memory, it is possible that the frequency data pertaining to that part of the sample signal which exits between any two adjacent sampling points is not obtained. To eliminate this possibility, a peak-holding circuit is used for the peak of the signal during each period of T/n. However, the peak-holding circuit may malfunction during a certain period of T/n or at the time the selection signal fluctuates. This is why the effective-data detecting circuit determines whether any data item obtained during any period of T/n is effective or not, in accordance with the selection signal and the peak-detecting signal. If the circuit determines that the data item is found effective, the data control circuit writes the data items into the data memory, together with an effective-data flag. The data control circuit reads the data item from the memory, when necessary.

When a signal to be measured, such as a BURST signal, is continuously swept for the time T by means of the ASSA or DSSA according to the invention, the frequency spectrum displayed looks like a comb, with some portion missing. If it is hard to analyze the comb-shaped spectrum, the sweep control unit controls the local oscillator of the high-frequency wave processing unit for a period which is not an integral multiple of the cycle-period of the selection signal, thus interpolating the missing portions of the frequency spectrum.

According to one aspect of the present invention, there is provided a spectrum analyzer comprising:
high-frequency signal processing means for frequency-converting a signal to be measured including measurement object waves recurring for a short period of time, into an intermediate-frequency signal, by using a local oscillation signal swept continuously over a desired range of frequencies, and thereby outputting a frequency spectrum of the signal to be measured;
detector means for detecting the frequency spectrum output by said high-frequency signal processing means;
selection signal supplying means for supplying a selection signal representing a desired portion of the spectrum in which lies the measurement object waves;
control means for outputting said portion of the spectrum demodulated by the demodulation means, in accordance with the selection signal supplied by the selection signal supplying means;
display means for displaying the frequency spectrum output by the control means; and
sweep control means for causing the high-frequency signal processing means to sweep the local oscillation signal repeatedly, each time for a period which is not an integral multiple of the cycle period of the selection signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A and 3B are diagrams representing two examples of frequency spectra, displayed by the first embodiment;

FIGS. 4A and 4B are diagrams illustrating other examples of frequency spectra, displayed by the first embodiment;

FIG. 11 is a view showing the data items stored in the data memory used in the present invention;

FIG. 17 is a block diagram illustrating a seventh embodiment of the invention, which is a digital-storage spectrum analyzer;

FIG. 18 is a block diagram representing an eighth embodiment of the present invention; and FIGS. 19 and 20 show frequency spectra displayed by the eighth embodiment, explaining how this embodiment functions.

DETAILED DESCRIPTION OF THE PREFERRED EMBODIMENTS

Figure 1:
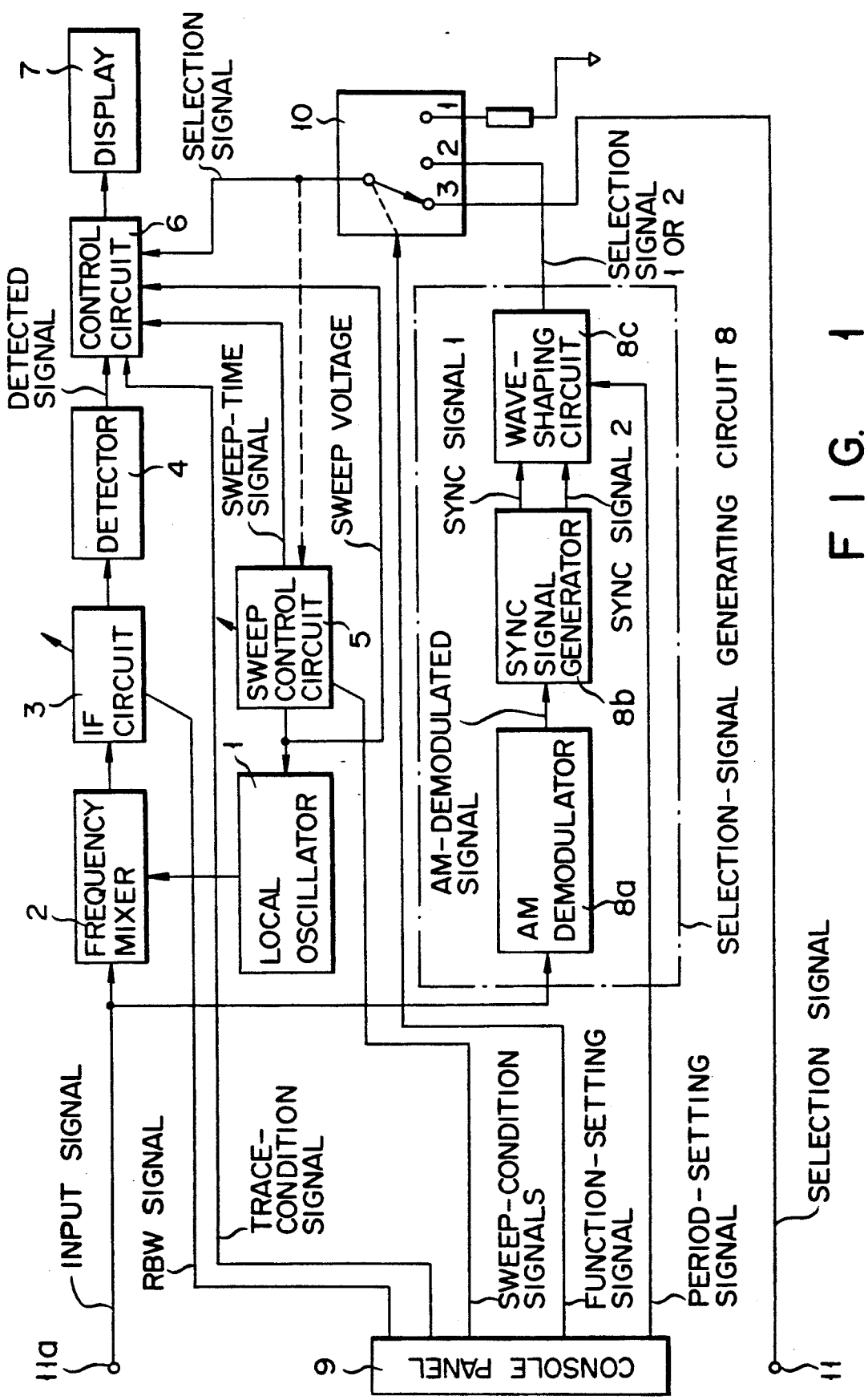
FIG. 1 is a block diagram illustrating a first embodiment of the present invention.

Reference will be made in detail to the presently preferred embodiments of the invention as illustrated in the accompanying drawings, in which like reference characters designate like or corresponding parts throughout the served drawings.

The invention can apply to both a digital-storage spectrum analyzer (DSSA) and an analog-storage spectrum analyzer (ASSA). The embodiments of the invention will now be described in detail, one by one.

First Embodiment

Figure 2:
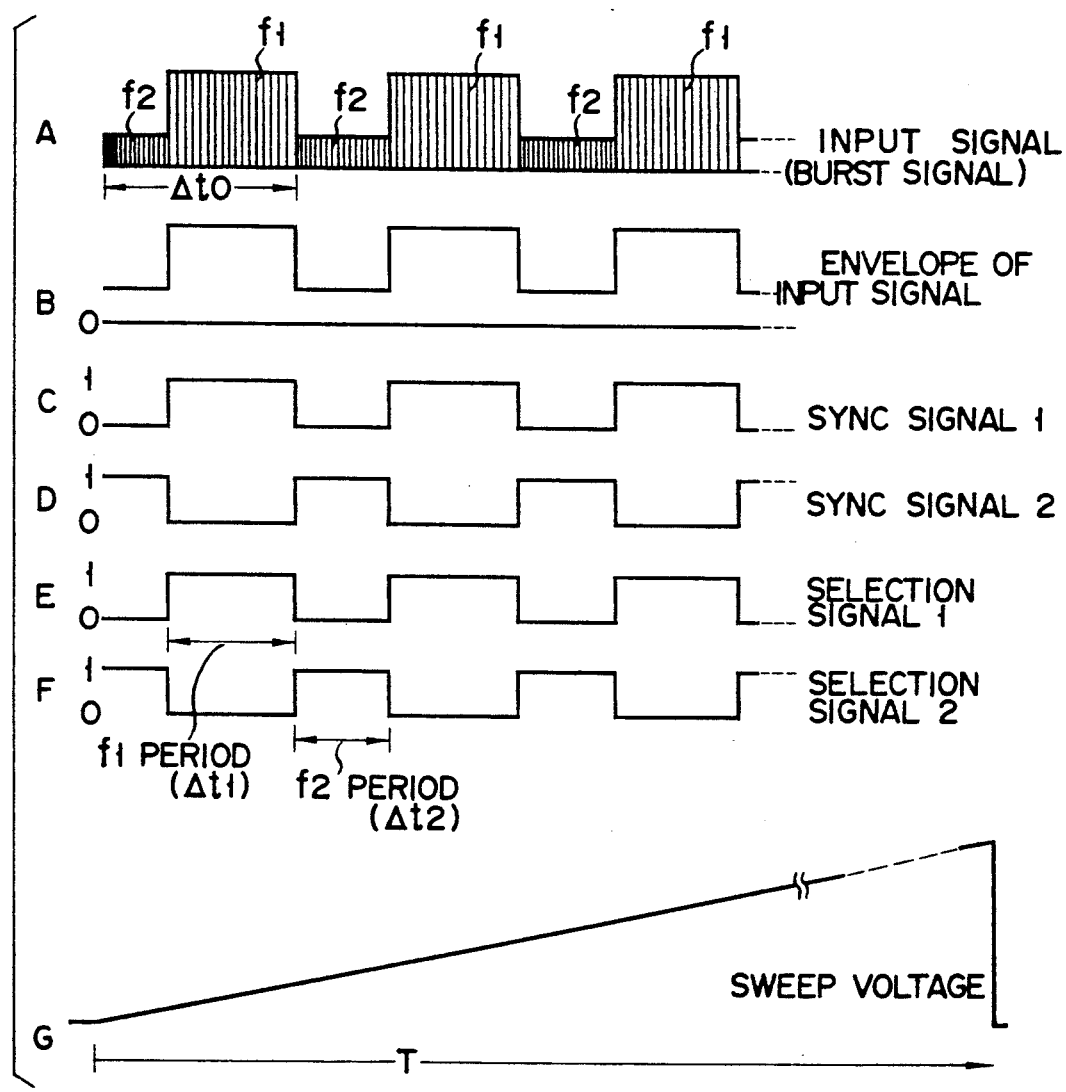
FIG. 2 is a timing chart showing the waveforms of the various signals processed and used in the first embodiment.

FIG. 1 illustrates a spectrum analyzer according to the first embodiment of the present invention, and FIG. 2 is a timing chart showing the waveforms of the various signals processed and used in this spectrum analyzer.

As is shown in FIG. 1, the spectrum analyzer comprises a local oscillator 1, a frequency mixer 2, an IF circuit 3, a detector 4, a sweep control circuit 5, a control circuit 6, a display 7, a selection-signal generating circuit 8, a console panel 9, a switching device 10, and terminals 11a and 11b.

The oscillator 1, the mixer 2, and IF circuit 3 constitute a high-frequency signal processing section. A local oscillation signal, which has been frequency-swept and output by the local oscillator 1, is input to the frequency mixer 2. Also supplied to the frequency mixer 2 is an object signal supplied to the input terminal 11a from an external device. The mixer 2 mixes the input signals, converting the object signal into an intermediate-frequency (IF) signal. The IF signal is input to the IF circuit 3. The IF circuit 3 selects a frequency spectrum of the object signal, which has the desired resolution band width (RBW) designated by the RBW set signal supplied from the console panel 9, and supplies the frequency spectrum to the detector 4. The detector 4 demodulates the frequency spectrum, generating analog data corresponding to the level of the spectrum.

The console panel 9 has many keys (not shown), which an operator operates, setting various set signals including the RBW set signal.

The sweep control circuit 5 receives sweep-condition set signals from the console panel 9, representing a sweep time T, a sweep-frequency range, and the like, and also receives a selection signal (later described). The circuit 5 generates a sweep voltage during the sweep time T, as is shown in G of FIG. 2. The sweep voltage is applied to the local oscillator 1, whereby the local oscillation signal is continuously swept over the sweep-frequency range.

The selection-signal generating circuit 8 is designed to generate two kinds of selection signals, in accordance with the waveform of the object signal supplied from the input terminal 11a. A selection signal of either kind is used to select a desired portion of the frequency spectrum demodulated by the detector 4. As is illustrated in FIG. 1, the circuit 8 comprises an AM demodulator 8a, a sync signal generator 8b, and a wave-shaping circuit 8c.

Figure 5A:
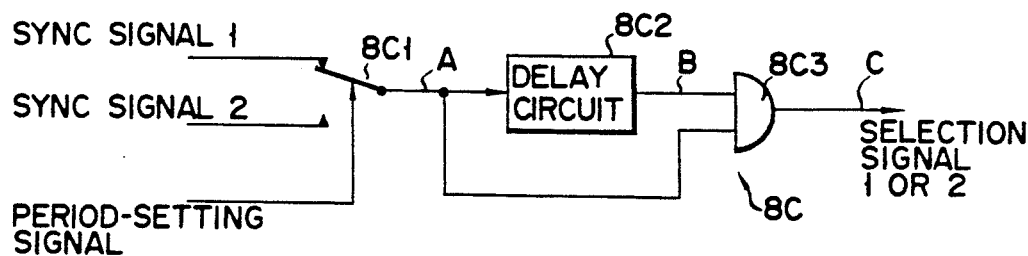
FIG. 5A is a circuit diagram showing the wave-shaping circuit incorporated in the first embodiment.
Figure 5B:
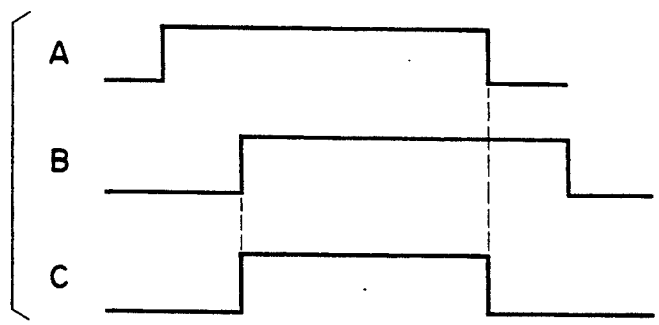
FIG. 5B is a timing chart explaining the operation of the wave-shaping circuit shown in FIG. 5A operates.

With reference to A to G in FIG. 2, it will be explained how the selection-signal generating circuit 8 generates the two kinds of selection signals. The AM demodulator 8a demodulates the object signal shown at A in FIG. 2, thus generating an envelope of the input shown at B in FIG. 2, which represents the envelope of signals of high frequencies (i.e., $f_1$ and $f_2$). The sync signal generator 8b compares the demodulated signal B with a reference voltage applied from an internal voltage source (not shown), and generates two sync signals 1 and 2. As is illustrated at C in FIG. 2, the sync signal 1 is at high level, or "1" level for every period the AM-demodulated signal is at the high frequency $f_1$. (Hereinafter, this period will be referred to as "$f_1$ period.") Also, as is shown at D in FIG. 2, the sync signal 2 is at the "1" level for every period the AM-demodulated signal is at the low frequency $f_2$. (This period will be referred to as "$f_2$" period.") As is illustrated in FIG. 5A, the wave-shaping circuit 8c has a switch 8c1, a delay circuit 8c2, and a two-input AND circuit 8c3. The switch 8c1 has two fixed contacts and one movable contact. The sync signals 1 and 2, both generated by the sync signal generator 8b are supplied to the fixed contacts of the switch 8c1, respectively. The movable contact of the switch 8c1 is contacted to either the first fixed contact or the second fixed contact, in accordance with a period-setting signal supplied from the console panel 9. Hence, the sync signal 1 or the sync signal 2 is supplied from the switch 8c1 to the delay circuit 8c2 and also to the first input of the AND circuit 8c3. The sync signal 1 or 2, delayed by the delay circuit 8c2 is supplied to the second input of the AND circuit 8c3. The AND circuit 8c3 generates a first selection signal 1 designated at E in FIG. 2, or a second selection signal 2 designated at F in FIG. 2. As is evident from FIG. 5B, either selection signal rises to the high level some time after the sync signal 1 or 2 has risen to the high level and which falls to the low level some time before the sync signal 1 or 2 delayed by the delay circuit 8c2 falls to the low level. Since either selection signal rises and falls in this specific way, the data is never determined to be effective, which has resulted from the signal output by the detector 4 and influenced by the transient response made by the frequency mixer 2 and/or the IF circuit 3. The delay time set to the delay circuit 8c2 is determined in accordance with the operating characteristics of the frequency mixer 2 and the IF circuit 3.

As is illustrated in FIG. 1, the switching device 10 has a movable contact and three fixed contacts 1, 2, and 3. The first fixed contact 1 is coupled to the ground potential, the second fixed contact 2 is connected to the output of the selection-signal generator 8, and the third fixed contact is connected the terminal 11b to which the selection signal is supplied from the external device. The movable contact is moved and connected to the first, second, or third fixed contact, in accordance with the function-setting signal supplied from the console panel 9. To analyze an ordinary, continuous signal, the movable contact is coupled to the first fixed contact 1. To analyze a BURST signal and to use the selection signal 1 or 2, the movable contact is coupled to the second fixed contact 2. To use the selection signal externally supplied, the movable contact is connected to the third fixed contact 3.

Figure 5C:
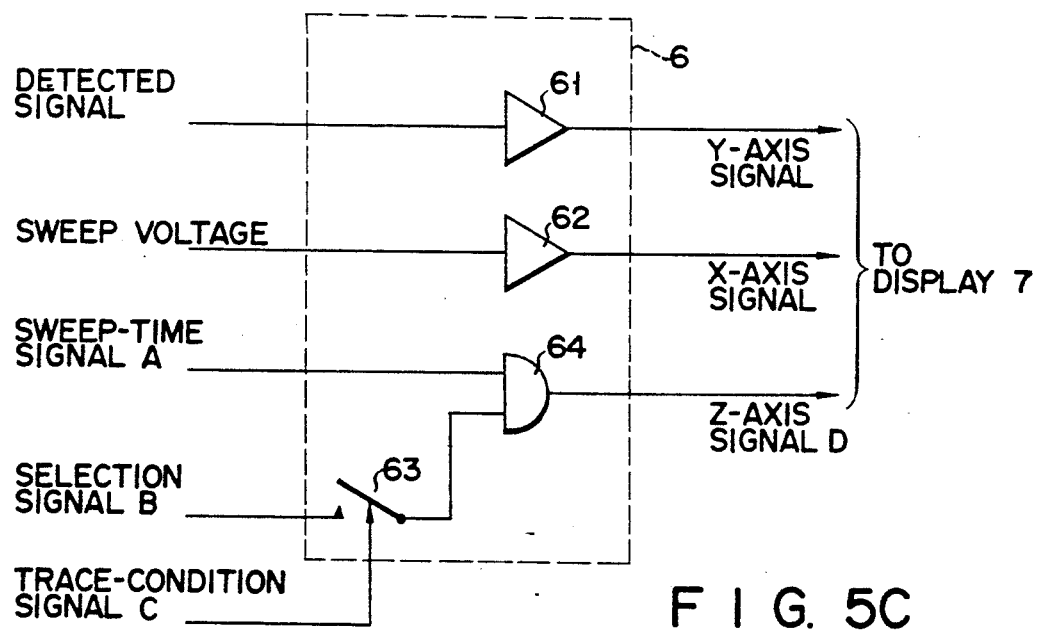
FIG. 5C is a circuit diagram illustrating an analog circuit which can be used as the control circuit incorporated in the first embodiment.
Figure 5D:
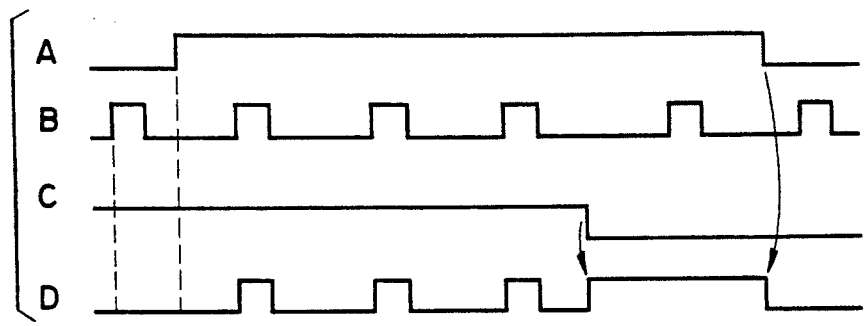
FIG. 5D is a timing chart explaining how the analog circuit shown in FIG. 5C operates.

The control circuit 6 is an analog circuit as can be understood from FIG. 5C. (Alternatively, the circuit 6 can be a digital circuit in the second and third embodiments of the invention, both being DSSAs and later described.) The control circuit 6 comprises amplifiers 61 and 62, a switch 63, and a two-input AND circuit 64. The amplifier 61 amplifies the signal output by the detector 4, and supplied the amplified signal as a vertical (Y-axis) signal to display 7 (e.g., a cathode-ray tube CRT.) The amplifier 62 amplifies the sweep voltage applied from the sweep control circuit 5, and applies the voltage as a horizontal (X-axis) signal to the display 7. The switch 63 is turned on in accordance with the trace-condition signal C, and supplies the selection signal B to the first input of the AND circuit 64. The sweep-time signal A is input to the second input of the AND circuit 64. Hence, the selection signal B is supplied to the display 7 through the AND circuit 64 during the sweep time T, at the timing shown in FIG. 5D. The X-axis signal and the Y-axis signal are analog ones. When the selection signal B is at the "1" level, the frequency spectrum of the signal output from the detector 4 is bright enough to be seen on the screen of the display 7 as the Z-axis signal D. The trace-condition set signal C is input by operating the console panel 9, specifying that portion of the frequency spectrum which the operator wishes to see on the screen of the display 7. That is to say, the trace-condition set signal is input by operating the console panel 9 and designates that portion of the frequency spectrum of the BURST signal which the operator wants to analyze.

It will now be explained how the spectrum analyzer illustrated in FIG. 1 operates when the movable contact of the switching device 10 is connected to the second fixed contact 2.

First, the sweep-condition set signals are supplied from the console panel 9 to the sweep control circuit 5, whereby a range of frequency is set, within which falls the frequencies $f_1$ and $f_2$ of the components of the BURST signal. The sweep control circuit 5 continuously sweeps the output frequency of the local oscillator 1, so that the spectrum of the BURST signal can be analyzed over the range of frequency thus set. The frequency mixer 2 mixes the BURST signal with the local oscillation signal output from the oscillator 1, and converts into an IF (BURST) signal. The IF (BURST) signal is input to the IF circuit 3. The circuit 3 selects that frequency spectrum of the BURST signal, which has the desired resolution band width (RBW) designated by the RBW set signal input from the console panel 9, and supplies the frequency spectrum to the detector 4. The detector 4 demodulates the frequency spectrum, generating analog data corresponding to the level of the spectrum. This analog data represents the frequency spectrum of the BURST signal, having a $f_1$-frequency component and a $f_2$-frequency component, which recur during the $f_1$ period and the $f_2$ period, respectively.

When a period-setting signal, which has been generated by operating the console panel 9 and designates the $f_1$ period, is supplied to the selection-signal generating circuit 8, the circuit 8 supplies the selection signal 1 to the control circuit 6 via the switching device 10. The circuit 6 controls the display 7 for the sweep time T, such that the spectrum shown in FIG. 3A is displayed on the screen on the display 7. The spectrum, thus displayed, includes portions which correspond to the $f_1$-frequency components of the BURST signal.

On the other hand, when a period-setting signal, which has been generated by operating the console panel 9 and designates the $f_2$ period, is supplied to the circuit 8, the circuit 8 supplies the selection signal 2 to the control circuit 6 via the switching device 10. The circuit 6 controls the display 7 for the sweep time T, such that the spectrum shown in FIG. 3B is displayed on the screen of the display 7. The spectrum, thus displayed, includes portions which correspond to the $f_2$-frequency components of the BURST signal.

As can be understood from FIG. 3A, the closer $\Delta t_1/\Delta t_0$ (the ratio of the f9 period to the cycle-period of the BURST signal) to the unit, that is, the less $\Delta t_0/T$, the more continuous the spectrum on the display screen appears. If it is hard to analyze the comb-shaped spectrum shown in FIG. 3A or 3B, the sweep control circuit 5 controls the local oscillator 1 to sweep the BURST signal for a period which is not an N times longer than the cycle-period of the selection signal which is equal to that ($\Delta t_0$) of the selection signal. Since there is a difference of $[T - N \times \Delta t_0]$ between the start of the each sweep and the leading edge of the selection signal, the missing portions of the frequency spectrum are interpolated, whereby the spectra shown in FIGS. 3A and 3B become continuous, as is shown in FIGS. 4A and 4B, over the frequency range the operator has set by operating the console panel 9. This technique of displaying a continuous frequency spectrum of the BURST signal is possible due to the afterglow of the display screen.

Figure 5E:
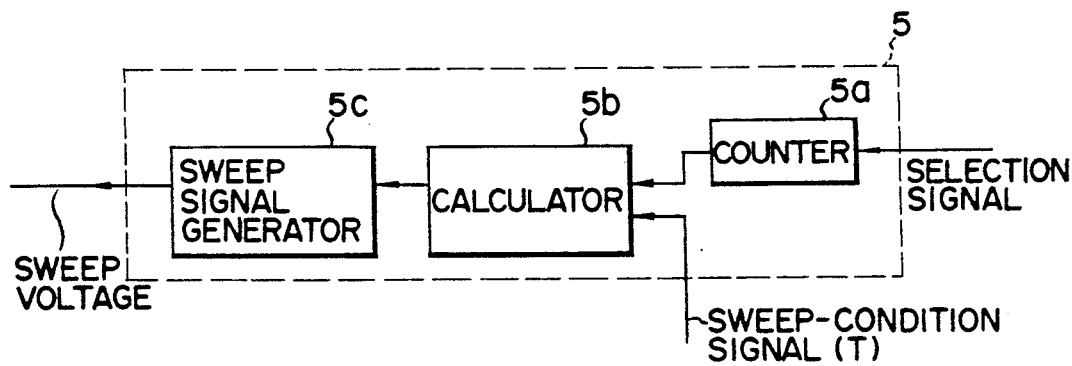
FIG. 5E is a circuit diagram illustrating an analog circuit which can be used as the sweep control circuit incorporated in the first embodiment.

The sweep control circuit 5 will be described in more detail, with reference to FIG. 5E. As this figure shows, the circuit 5 comprises a counter 5a, a calculator 5b, and a sweep signal generator 5c. The counter 5a receives the selection signal, detects the cycle period $\Delta t_0$ of the selection signal, and supplies the signal representing the cycle period $\Delta t_0$, to the calculator 5b. The sweep time signal T is supplied to the calculator 5b from the console panel 9. The calculator 5b obtains, from the period $\Delta t_0$ and the sweep time T, the value of Mx which satisfies the following equation:

$$\Delta t_1 \geq \Delta t_0/M$$

Then, the calculator 5b finds the value of N which satisfies the following equation:

$$T - N \times \Delta t_0 = \Delta t_0/Mx$$

Using the value Nx of N, the calculator 5b further obtains Tx which is given as follows:

$$Tx = (Nx + 1/Mx) \times \Delta t_0$$

The calculator 5b inputs the data representing Tx to the sweep signal generator 5c. The generator 5c generates a sweep signal, or a sweep voltage, and applies the sweep voltage to the local oscillator 1. The oscillator 1 sweeps the BURST signal at least Mx times during the sweep time Tx, whereby the frequency spectrum of the object signal is displayed over the entire frequency range the operator has set by operating the console panel 9.

The spectrum analyzer shown in FIG. 1 can display not only a continuous spectrum of a BURST signal, but also a continuous frequency spectrum of a 90 MHz RF signal which has been modulated with a video signal containing a horizontal sync signal and a vertical sync signal. More specifically, the sync signal generator 8b of the selection-signal generating circuit 8 separate the video signal into the horizontal sync signal and the vertical sync signal. These sync signals are used as the first sync signal 1 and the second sync signal 2. The sync signals 1 and 2 are input to the wave-shaping circuit 8c. The circuit 8c generates the selection signal 1 or 2, in accordance with the sync signals 1 and 2 and the period-setting signal supplied from the console panel 9. Hence, the spectrum analyzer allows for not only the analysis of a BURST signal, but also the analysis of a 90 MHz RF signal.

Moreover, the spectrum analyzer illustrated in FIG. 1 can display the frequency spectrum of a high-frequency signal modulated with a video signal. When the source of the video signal generates, in the process of forming the video signal, a signal equivalent to the selection signal 1 or 2, and this video signal source is located close to the spectrum analyzer, this signal can be used as the selection signal. To be more precise, the movable contact of the switching device 10 is connected to the third fixed contact 3, so that the signal equivalent to the selection signal is supplied to the control circuit 6 through the terminal 11b and the switching device 10. In this case, the spectrum analyzer is efficiently used to inspect video signal sources and video apparatuses.

Second Embodiment

The second embodiment of the present invention is applied to a DSSA. It is identical in structure and operation to the first embodiment (FIG. 1), except for a digital control circuit 6A is used in place of the analog control circuit 6. The digital control circuit 6A will be described, with reference to FIG. 6A.

Figure 6A:
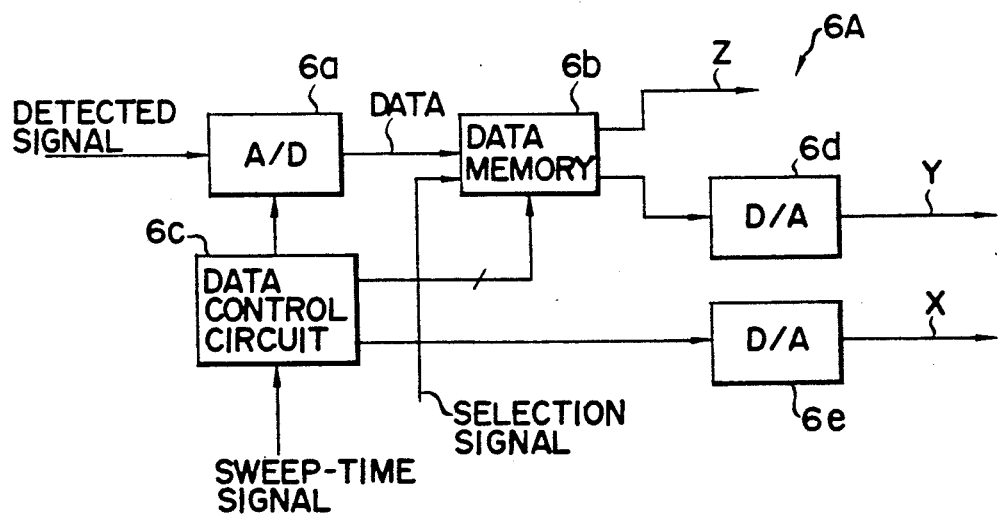
FIG. 6A is a block diagram showing a digital circuit which can be used as the control circuit incorporated in a second embodiment of the present invention.

As is illustrated in FIG. 6A, the control circuit 6A comprises an A/D converter 6a, a data memory 6b, a data control circuit 6c, and D/A converters 6d and 6e. The data control circuit 6c generates a clock signal for the sweep time represented by the sweep-time signal supplied from a sweep control circuit 5 (see FIG. 1). The clock signal is supplied to the A/D converters 6a, the data memory 6b, and the D/A converter 6e. In synchronism with the clock signal, the A/D converter 6a converts the output signal of a detector 4 (see FIG. 1) into digital data. The digital data is written into the data memory 6b, also in synchronism with the clock signal supplied to the memory 6b from the data control circuit 6c. A selection signal is also written as an effective-data flag into the data memory 6b. This flag is a "1" bit designating a desired period included in the sweep time, or a "0" bit designating a non-desired period including in the sweep time. The data memory 6b is designed so as to read data during the blanking period between the adjacent sweep periods. The effective-data flag is read from the data memory 6b and input, as a Z-axis signal, to a display 7 (see FIG. 1). The digital data is read from the memory 6b and input to the D/A converter 6d. The D/A converter 6d converts the digital data into analog data, which is input, as a Y-axis signal, to the display 7. The D/A converter 6e converts the clock signal supplied from the data control circuit 6c, into an X-axis signal, and supplies the X-axis signal to the display 7.

Figure 6B:
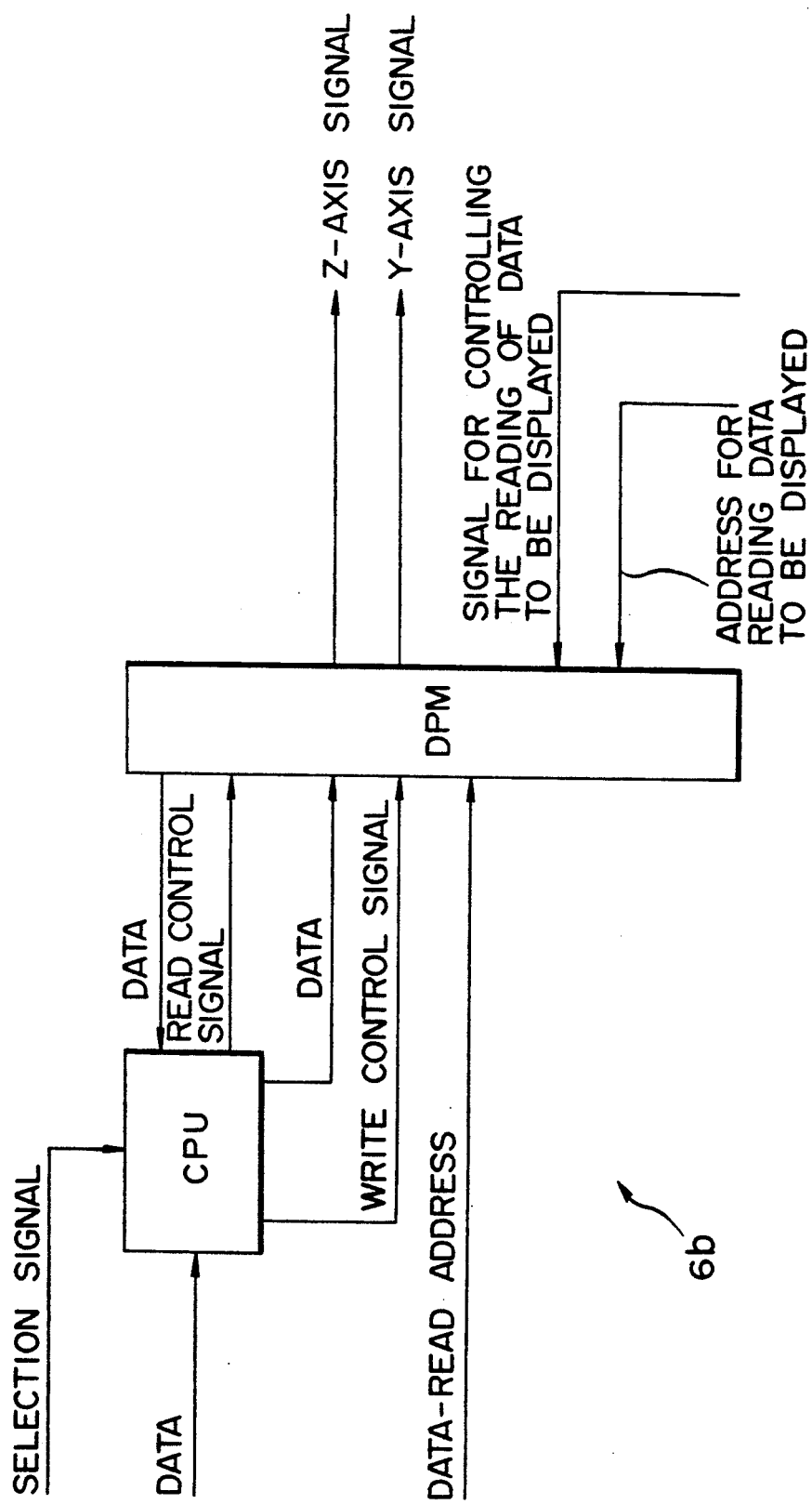
FIG. 6B is also a block diagram illustrating the data memory used in the digital circuit shown in FIG. 6A.

As is shown in FIG. 6B, the data memory 6b comprises a microcomputer (CPU) and a dual-port memory (DPM). The CPU receives the selection signal and the digital data, and supplies the digital data and a write control signal to the DPM, whereby the digital data is written into the DPM. To read the data from the DPM, the CPU supplies a read control signal to the DPM. In response to the data-read address supplied from the data control circuit 6c, the DPM supplies the data to the CPU. Further, in response to the data-read control signal and the data-read address, both supplied from the data control circuit 6c, the DPM inputs the Y-axis signal and the Z-axis signal.

Figure 6C:
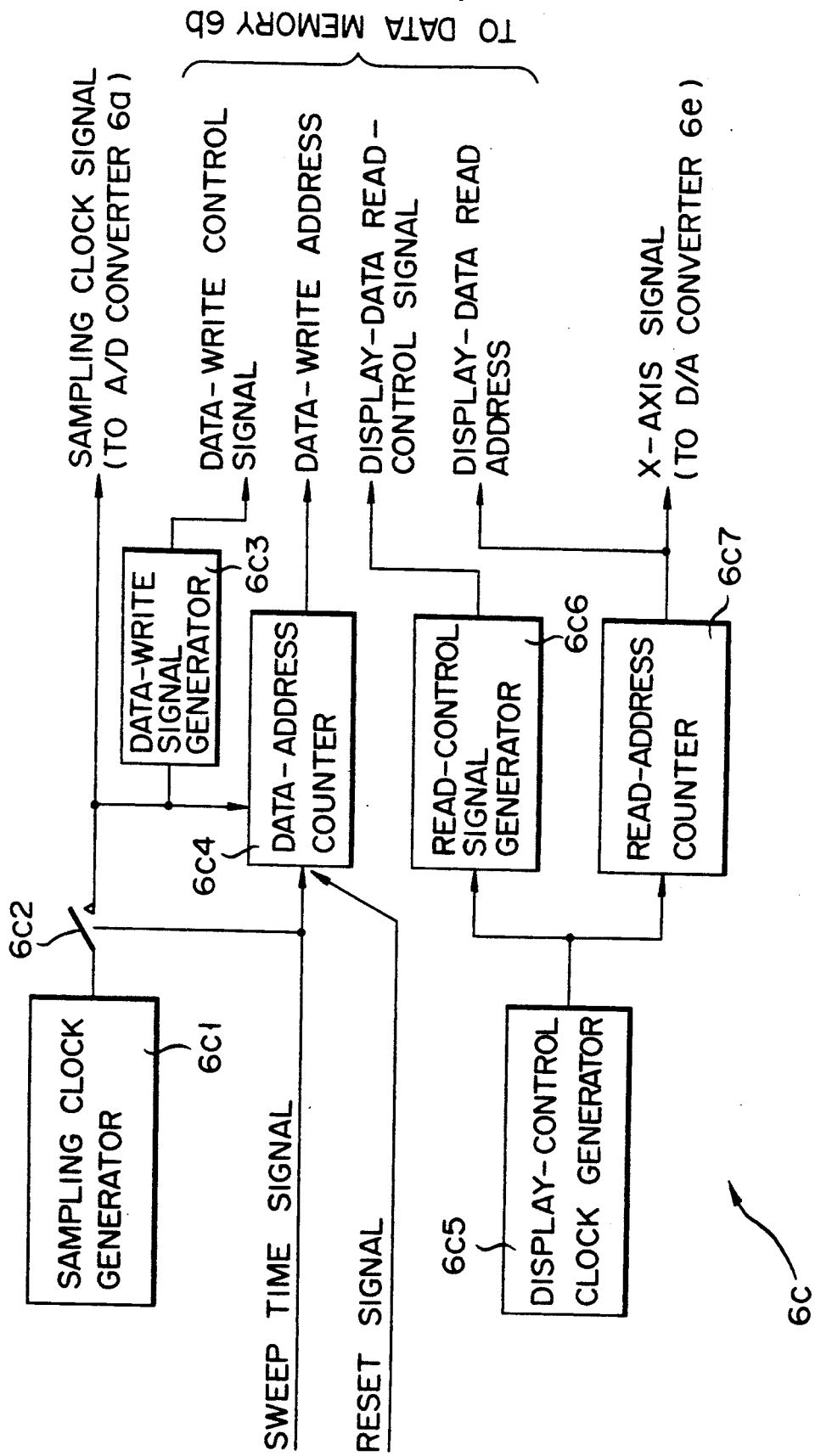
FIG. 6C is a block diagram illustrating the data control circuit incorporated in the digital circuit shown in FIG. 6A.

As is illustrated in FIG. 6C, the data control circuit 6c comprises a sampling clock generator 6c1, a switch 6c2, a data-write signal generator 6c3, a data-address counter 6c4, a display-control clock generator 6c5, a read-control signal generator 6c6 for generating a signal for controlling the reading of the data to be read-addresses of the data to be displayed. The clock signal output by the sampling clock generator 6c1 is supplied to the A/D converter 6a, the data memory 6b, and the D/A converter 6e during the sweep time through the switch 6c2. The data-write signal output by the generator 6c3 is supplied to the data memory 6b. The data-write address output by the data-address counter 6c4 is also supplied to the data memory 6b. The clock signal generated by the generator 6c5 is input to the generator 6c6 and the counter 6c7. The data-read control signal output by the generator 6c6 is supplied to the data memory 6b. The data-read address output by the read-address counter 6c7 is supplied to the data memory 6b, and also, as the X-axis signal to the D/A converter 6e.

FIG. 11 is a view showing the data which has been written in the data memory 6b during the period equal to the sweep time T. The memory 6b stores, at 500 addresses, 500 data items, along with effective-data flags. The data items represent the frequencies falling within the range set by operating the console panel 9. Each frequency data item is valid when the effective-data flag assigned to it is a good mark "o", and is invalid when the effective-data flag is a bad mark "x". When the flag assigned to any frequency data item is a bad mark "x", the minimum level detected is written at the address, instead of the data item.

When the data items shown in FIG. 11 are read from the data memory 6b and input to the display 7, the display 7 will display such a discontinuous frequency spectrum as is illustrated in FIG. 3A. In this case, the missing portions of the spectrum correspond to the data items to which the bad marks "x" are assigned as effective-data flags, whereas the displayed portions of the spectrum correspond to the data items to which the good mark "o" are assigned as effective-data flags.

In the DSSA, i.e., the second embodiment of the invention, the frequency sweep is repeated, thereby collecting, in the data memory 6b, data items representing a frequency spectrum of a sample signal. More specifically, the effective-data flag assigned to any data item obtained in a sweep period is compared with the effective-data flag assigned to the data item acquired in the preceding sweep period, and the data items are written into the memory 6b in the specific logic represented in FIG. 12. Therefore, when the sweep control circuit 5, which is identical to that one incorporated in the first embodiment (FIG. 1) sweeps a BURST signal at least Mx times during the sweep time Tx, the data item are written into the data memory 6b, which data items are effective to form the spectrum of the BURST signal over the entire frequency range the operator has set by operating the console panel 9. In this case, the missing portions of the spectrum (FIG. 3A), corresponding to the data items to which the bad mark "x" flags are assigned, are interpolated with the data items to which the good mark "o" flags are assigned. As a result, the spectrum becomes such a spectrum as is shown in FIG. 4A, which is continuous over the frequency range set by the operator.

Third Embodiment

The third embodiment of the present invention is also a DSSA, like the second embodiment. The third embodiment is different from the first and second embodiments, only in that the data items written into a data memory 6b are only those which have been acquired during the desired period included in the sweep time T. (In the first and second embodiments, the data items obtained during the desired period are selected from those stored in the data memory 6b or from those supplied to the display 7.)

The third embodiment is identical in structure to the first embodiment (FIG. 1), except that no components equivalent to the display 7 are used, and that a digital control circuit 6B is used in place of the analog control circuit 6. The digital control circuit 6B will be described, with reference to FIG. 7A.

Figure 7A:
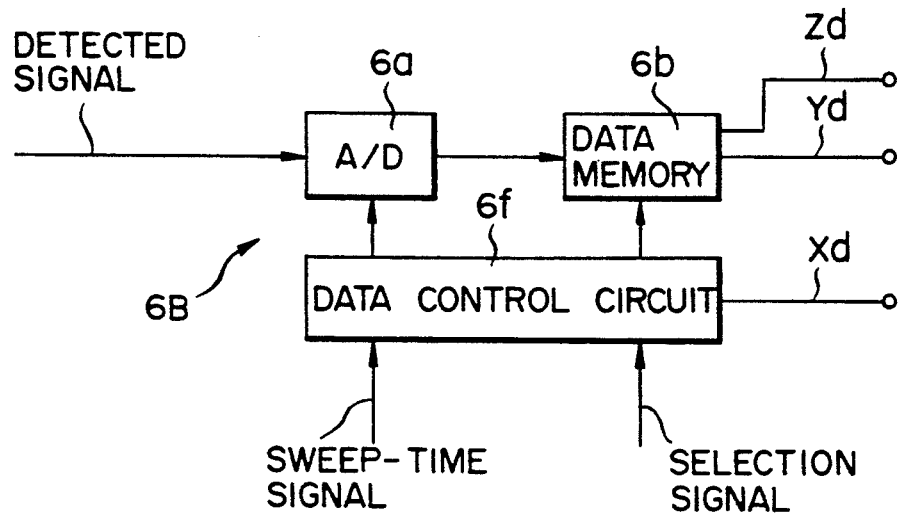
FIG. 7A is a block diagram showing a digital circuit which can be used as the control circuit incorporated in a third embodiment of the present invention.

As is illustrated in FIG. 7A, the digital control circuit 6B comprises an A/D converter 6a, a data memory 6b, and a data control circuit 6f. The control circuit 6b is so designed to supply a Y-axis signal Yd and a Z-axis signal Zd, and, if necessary, an X-axis signal Xd, to a host computer (not shown) so that the host computer can control and process these axis signals Xd, Yd, and Zd, thereby to display the frequency spectrum of the sample signal in the same way as in the first and second embodiments.

The operation of the control circuit 6B will be explained, with reference to FIG. 7A. The other components of the third embodiment operate, exactly in the same way as their equivalents incorporated in the first embodiment.

The sweep-time signal and the selection signal are supplied to the data control circuit 6f. The circuit 6f outputs an X-axis signal Xd (i.e., the address data) to the host computer and also to the data memory 6b, designating all addresses of the data memory 6b. Further, the circuit 6f generates a sampling clock signal from the X-axis signal Xd, and supplies the clock signal to the A/D converter 6a. The data control circuit 6f also controls the data memory 6b in accordance with the selection signal, such that the data items are written into the memory 6b, along with the effective-data flags, for only the periods during which the selection signal is at the "1" level. In other words, only those of the data items input to the A/D converter 6a, which have been acquired during the desired period, are written into the data memory 6b and read therefrom in the form of the Y-axis signal Yd. The effective-data flags assigned to the data items acquired during the desired period are read from the memory 6b as the Z-axis signal Zd.

In the third embodiment, only those of the effective-data flags shown in FIG. 11, which are the good marks "o", and only the data items to which these flags are assigned, are stored into the data memory 6b. Hence, the third embodiment is efficient, particularly when the object signal has been swept so many times that all flags in the memory 6b are expected to be the bad marks "x".

Figure 7B:
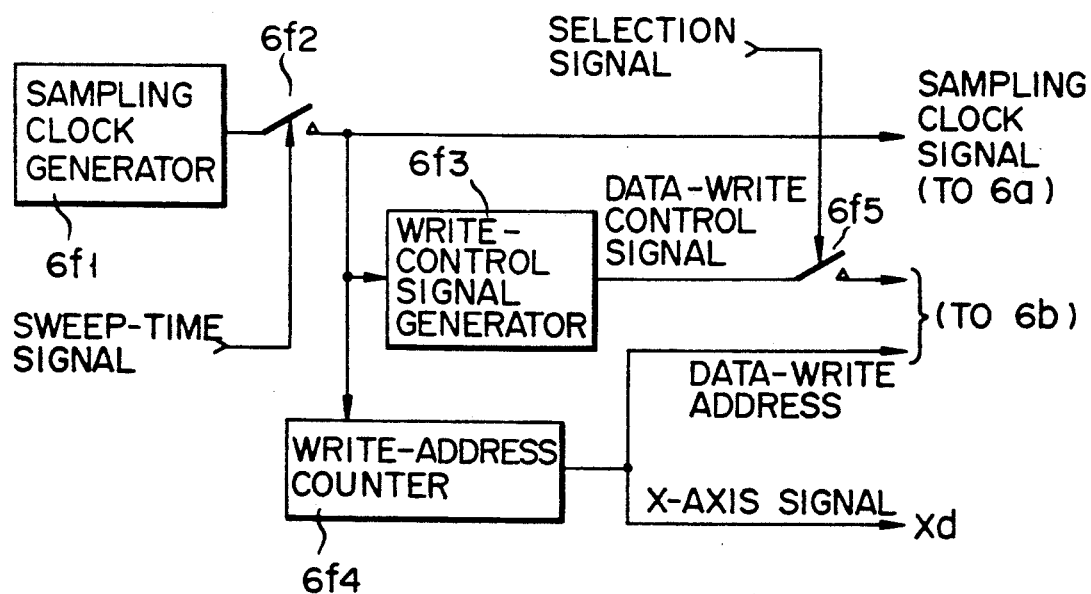
FIG. 7B is a block diagram showing the data control circuit incorporated in the digital circuit shown in FIG. 7A.

As is illustrated in FIG. 7B, the data control circuit 6f of the control circuit 6B comprises a sampling clock generator 6/1, a switch 6/2, a data-write control signal generator 6/3, a write address counter 6/4, and a switch 6/5. The clock generator 6/1 generates a sampling clock signal. This clock signal is supplied to the data-write control signal generator 6/3, the write address counter 6/4, and the A/D converter 6a, via the switch 6/2 which remains closed for the sweep time represented by the sweep-time signal supplied from a console panel (see FIG. 1). The generator 6/3 generates a data-write control signal, which is supplied to the data memory 6b through the switch 6/5 which remains closed for the duration of the control signal supplied from a switching device (see FIG. 1). The address counter 6/4 generates a data-write address and an X-axis signal Xd, from the sampling clock signal. The data-write address is input to the data memory 6b, and the X-axis signal Xd is input to the display (see FIG. 1).

Fourth Embodiment

Figure 8A:
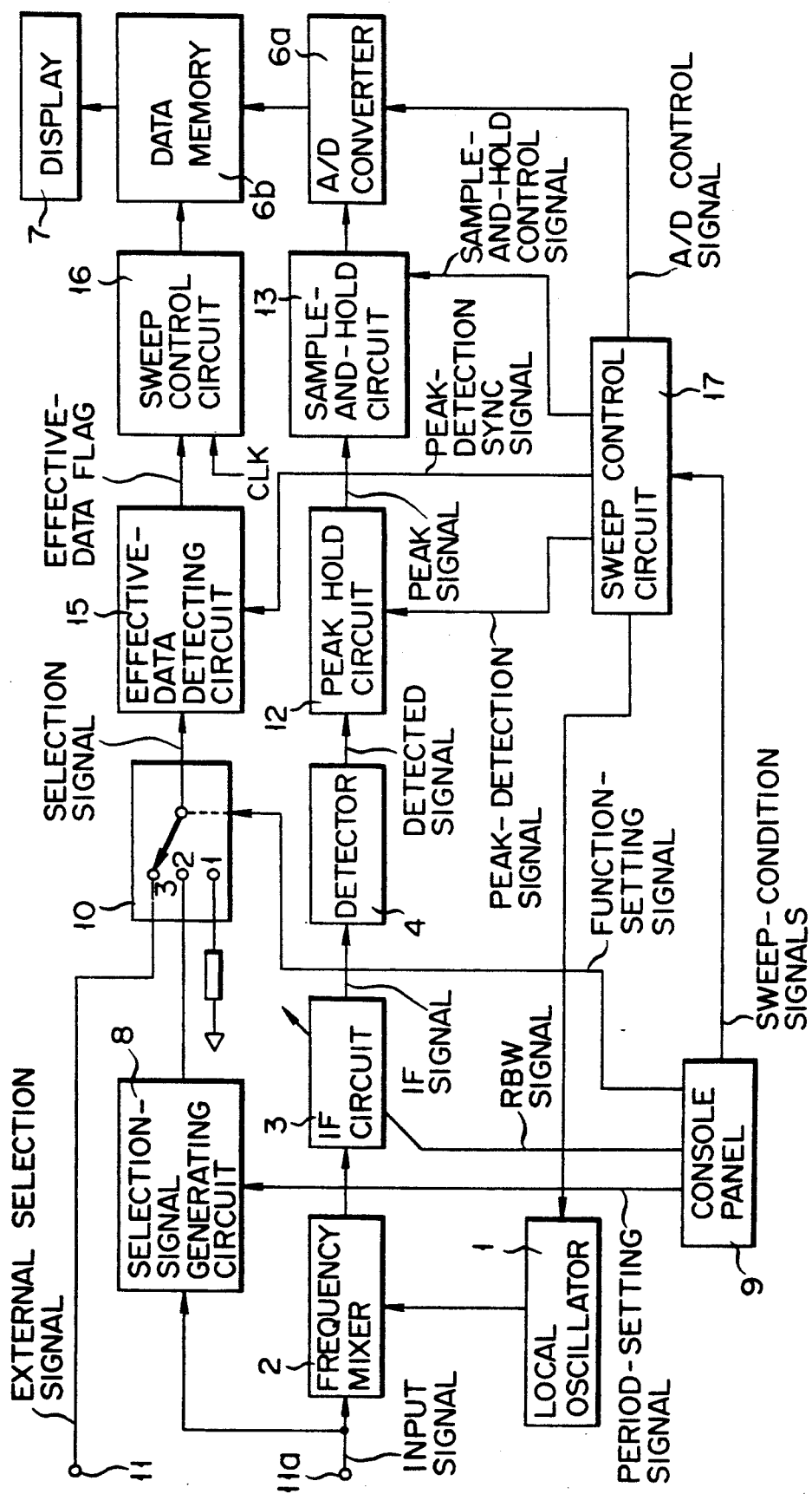
FIG. 8A is a block diagram illustrating a fifth embodiment of the present invention.

The fourth embodiment of the invention is also a DSSA. It is identical to the second and third embodiments, except that a peak hold circuit 12 is connected to the output of a detector 4 as is illustrated in FIG. 8A. The peak hold circuit 12 and the sample-and-hold circuit 13 coupled to the output of the circuit 12 are operated in synchronism with a selection signal.

Generally, in the case of a DSSA, the data memory, e.g. the memory 6b shown in FIG. 6B, has 500 addresses for storing 500 data items representing the frequencies falling within a sweep-frequency range, or a band width (BW) The 500 addresses correspond to 500 sampling points. The second and third embodiments can obtain frequency data over the entire sweep-frequency range, provided the RBW of the IF circuit 3 is BW/500 or greater. If the RBW of the IF circuit 3 is less than BW/500, the second and third embodiments cannot obtain a frequency data item pertaining to each portion of the sample signal which exists between two adjacent sampling points.

The fourth embodiment is designed to obtain frequency data over the entire sweep-frequency range, even if the RBW of the IF circuit 3 is less than BW/500. More precisely, the peak hold circuit 12 holds the frequency peak level existing between the mth sampling point and the (m+1)th sampling point, so that this peak level is used as the frequency data item pertaining to the (m+1)th sampling point. When the selection signal switched at some time between the mth sampling point and the (m+1)th sampling point, the effective-data flag assigned as good mark "o" to the mth sampling point is rendered valid for only the period the selection signal is at the "1" level while the peak level is being detected. This technique helps to form a continuous frequency spectrum of the sample signal such as a BURST signal.

The fourth embodiment will no be described in detail, with reference to FIGS. 8A, 8B, 8C, 9, 10, and 12. In FIG. 8A, the same numerals are used to designate the same components as those shown in FIG. 1, FIG. 6C, and FIG. 7A. As is shown in FIG. 8A, the fourth embodiment has a peak hold circuit 12, a sample-and-hold circuit 13, and an effective-data detecting circuit 15, and a sweep control circuit 17.

Figure 8B:
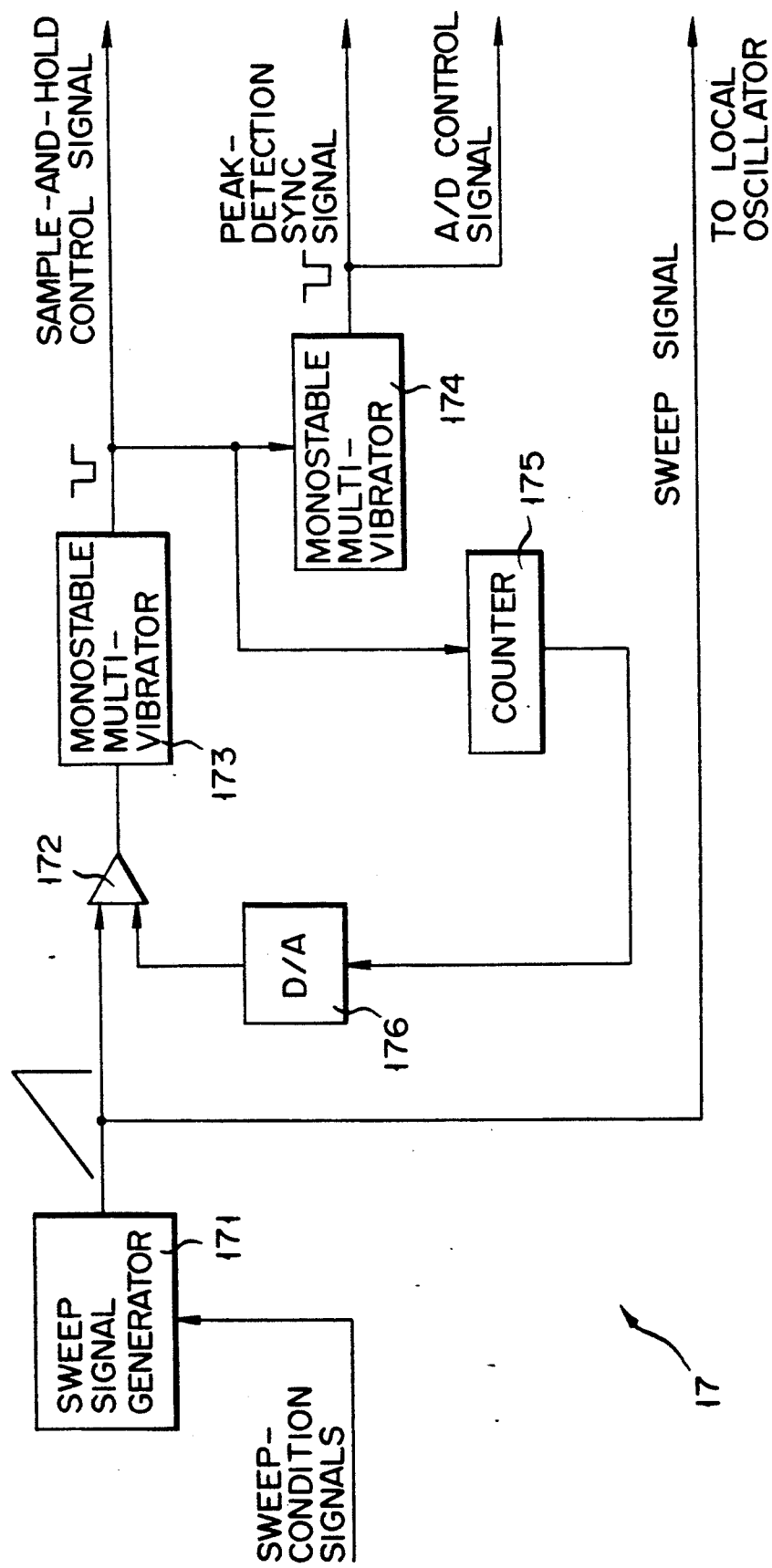
FIG. 8B is a block diagram showing the sweep control circuit incorporated in the fifth embodiment.

As is illustrated in FIG. 8B, the circuit 17 comprises a sweep-signal generator 171, a comparator 172, monostable multivibrators 173 and 174, a counter 175, and a D/A converter 176. The circuit 17 receives various sweep-condition set signal representing the sweep time T and supplied from a console panel 9, and generates a peak-detection signal having a frequency of T/500, a peak-detection sync signal synchronous with the sample-and-hold control signal, a sample-and-hold control signal, and an A/D control signal synchronous with the sample-and-hold control signal. The peak-detection signal is input to the peak hold circuit 12. The peak-detection sync signal is input to the effective-data detecting circuit 15. The sample-and-hold control signal is supplied to the sample-and-hold circuit 13. The A/D control signal is input to an A/D converter 6a.

Figure 8C:
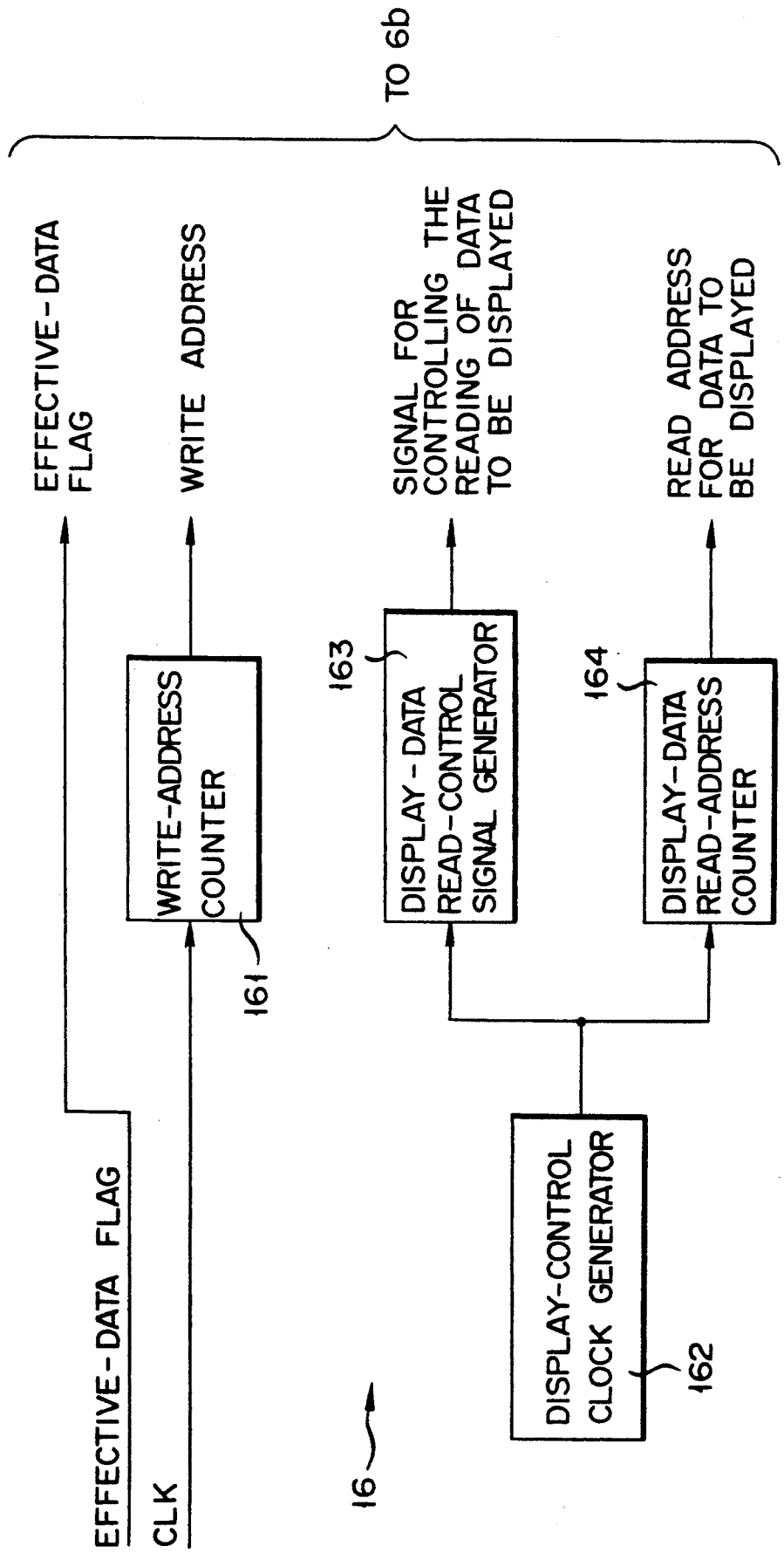
FIG. 8C is also a block diagram showing the data control circuit used in the fifth embodiment.
Figure 9:
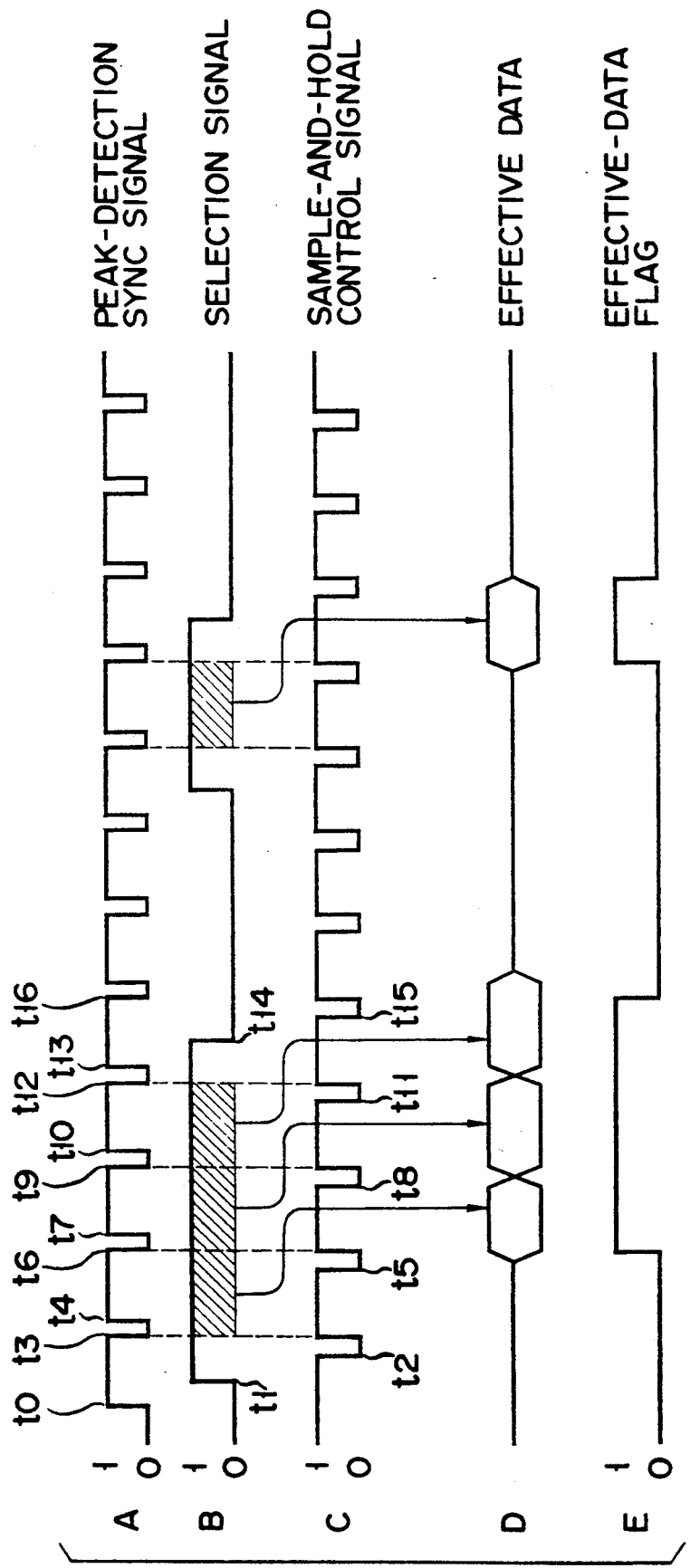
FIG. 9 is a timing chart representing the waveforms of the various signals processed and used in the fifth embodiment shown in FIG. 8A.

As is shown in FIG. 8C, the effective-data detecting circuit 15 comprises two D flip-flops 15a and 15b. The circuit 15 receives the selection signal and the peak-detection sync signal denoted at A and B in FIG. 9, respectively, and outputs an effective-data flag designated at E in FIG. 9. More specifically, the flip-flop 15a detects the selection signal at the leading edge of the peak-detecting sync signal. Hence, as is shown in FIG. 9, the flip-flop 15a detects that the selection signal is at the "1" level at time $t_4$. Thereafter, the flip-flop 15a holds the value of "1" until the selection signal falls to the "0" level at time $t_{14}$. In other words, the flip-flop 15a clears the value of "1" at time $t_{14}$. Similarly, the flip-flop 15b starts holding the output signal of the flip-flop 15a at the leading edge of the peak-detection sync signal, and outputs the signal as an effective-data flag. The effective-data indicates that any peak-detection period is valid during which the selection signal remains at the "1" level, and that any peak-detection period is invalid during which the selection signal does not remain at the "1" level. Thus, as can be understood from FIG. 9, the peak-detection periods $t_4-t_6$, $t_7-t_9$, $t_{10}-t_{12}$ are valid, whereas the peak-detection periods $t_0-t_3$ and $t_{13}-t_{16}$ are invalid. The effective-data flag is delayed with respect to the peak-detection sync signal by the cycle-period thereof.

The peak hold circuit 12 holds the signal detected by the detector 4 (FIG. 8A) during each peak-detection period, and supplies the signal to the sample-and-hold circuit 13. The sample-and-hold circuit 13 samples the signal at the leading edge of the sample-hold control signal designated at C of FIG. 9. The A/D converter 6a converts the signal into digital data. The digital data is delayed by the cycle period of the peak-detection sync signal, with respect to the signal detected by the detector 4. This is because the signal which has been held for the period $t_4-t_6$ is sampled at time $t_6$ and held for the period $t_6-t_9$. Hence, the digital data is synchronous with the effective-data flag.

In the fourth embodiment (FIG. 8A), a data control circuit 16 write the digital data output by the A/D converter 6a and the effective-data flag indicating the validity of the digital data, into the data memory 6a, along with the data representing the frequency corresponding to the digital data. Hence, the data memory 6b will also store such data items as are shown in FIG. 11. When the contents of the memory 6b are read out and supplied to the display 7, the display 7 will display the same frequency spectrum as that displayed by the second embodiment.

Figures 10, 12:
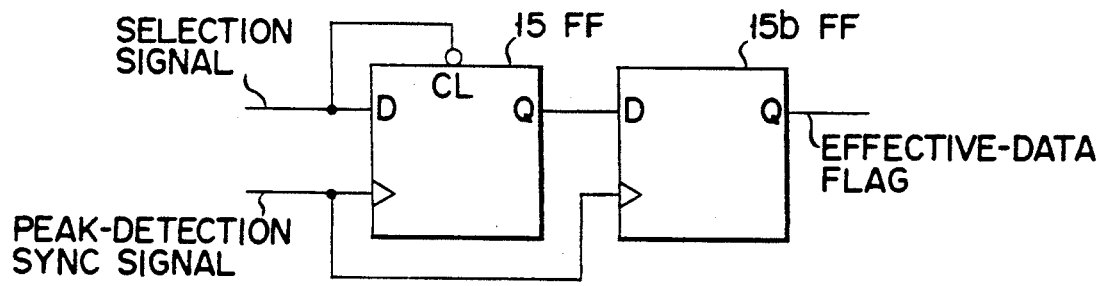
FIG. 10 is a diagram illustrating, in detail, the effective-data detecting circuit incorporated in the fifth embodiment.
FIG. 12 is a view showing the logic of writing data into the data memory.

Unlike the second embodiment, the fourth embodiment can display a spectrum of a BURST signal which is continues enough to be analyzed, even if the RBW set to the IF circuit 3 is relatively small. This is because of the operation of the sample-and-hold circuit 13. Further, since the selection signal and the peak-detection signal are synchronized, a logic operation can be correctly performed at each sampling point, as is shown in FIG. 12. In other words, correct data can be collected each time the sample signal is swept.

As is shown in FIG. 8C, the data control circuit 16 comprises a write-address counter 161, a display-control clock generator 162, a display-data read-control signal generator 163, and display-data read-address counter 164, in addition to a through line for supplying effective-data flags.

Fifth Embodiment

As has been described, the fourth embodiment (FIG. 8A) is designed to operate properly when the desired portion of a sample signal (i.e., the duration of the selection signal) is longer than the cycle period of the peak-detection sync signal. By contrast, the fifth embodiment is designed to provide data about the desired portion of a sample signal even if this portion of the signal is shorter than the cycle period of the peak-detection sync signal, provided that the portion of the sample signal lasts for a predetermined time (Tp) within the period cycle of the peak-detection sync signal.

Figure 13:
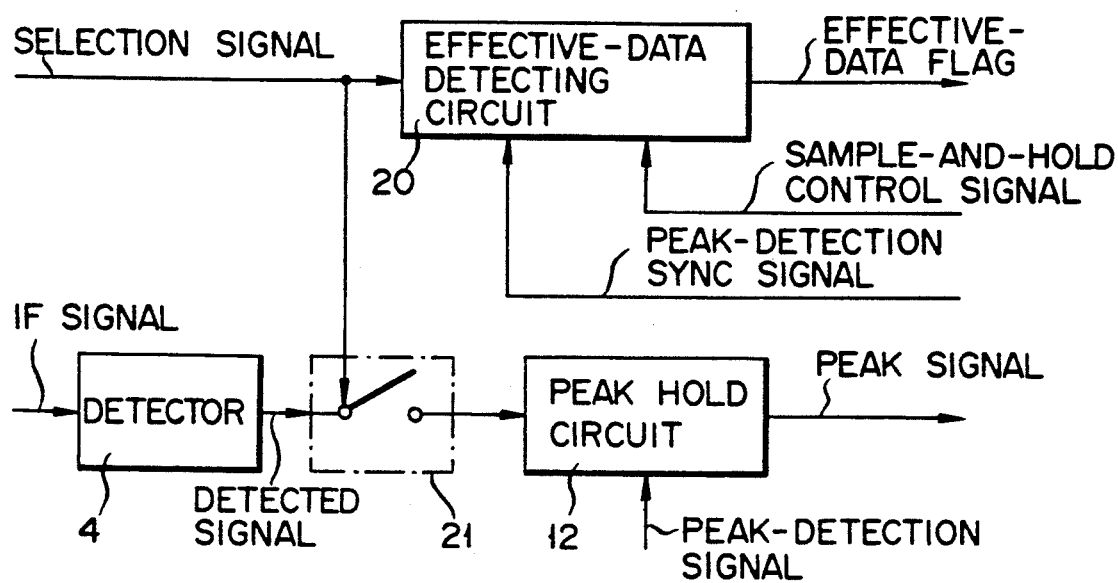
FIG. 13 is a block diagram illustrating the main section of the fifth embodiment.
Figure 14:
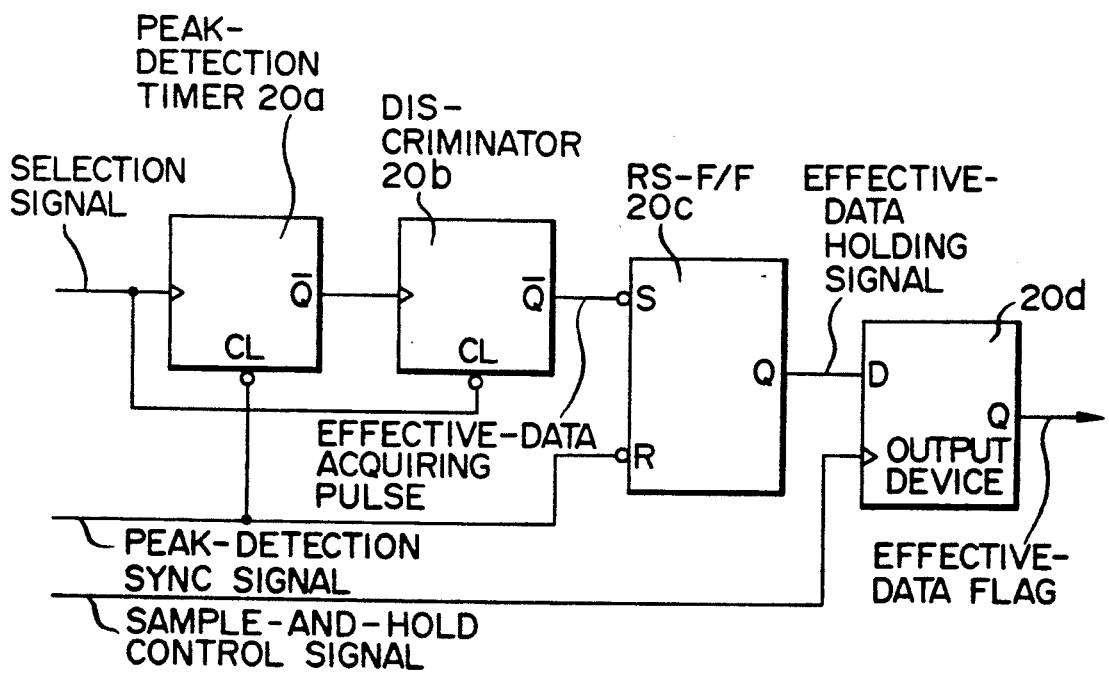
FIG. 14 is a circuit diagram showing, in detail, the effective-data detecting circuit incorporated in the main section shown in FIG. 13.
Figure 15:
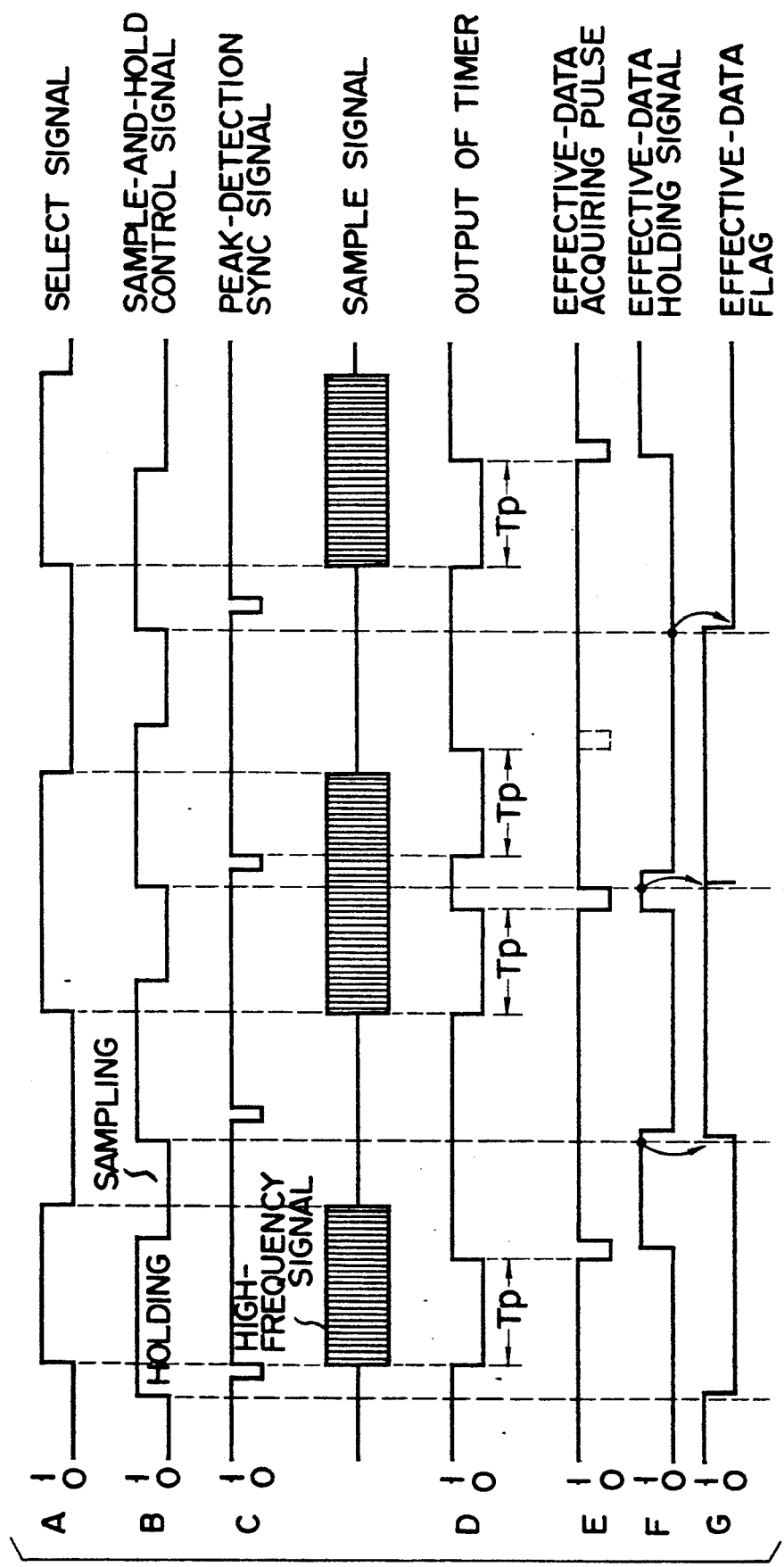
FIG. 15 is a timing chart showing the waveforms of the various signals used in the main illustrated in FIG. 13.

With reference to FIGS. 13, 14, and 15, the fifth embodiment will be described, in comparison with the fourth embodiment. As is evident from FIG. 13, a switch 21 is connected between a detector 4 and a peak hold circuit 12. The switch 21 is closed for the duration of every selection signal supplied to it. Hence, only the desired portion of a sample signal is supplied from the detector 4 to the peak hold circuit 12 via the switch 21. The selection signal is supplied to an effective-data detecting circuit 20. Also supplied to the circuit 20 are a peak-detection sync signal and a sample-and-hold control signal. The circuit 20 determines whether or not the portion of the sample signal lasts for the predetermined time (Tp) within the period cycle of the peak-detection sync signal. If YES, the circuit 20 determines that the data about this portion is valid, and outputs an effective-data flag. If NO, the circuit 20 finds that the data is invalid, and outputs an ineffective-data flat. As for all other operation aspects, the fifth embodiment is identical to the fourth embodiment.

The effective-data detecting circuit 20 will be described in detail, with reference to FIG. 14. As is shown in this figure, the circuit 20 comprises a peak-detection timer 20a, a discriminator 20b, a RS-FF 20c, and an output device 20d. FIG. 15 is a timing chart representing the operation of the effective-data detecting circuit 20. As can be understood from FIG. 15, the peak-detection timer 20a outputs a signal which falls to the "0" level at the leading edge of either the selection signal or the peak-detection sync signal and remains at the "0" level for the predetermined time Tp. The discriminator 20b outputs a negative pulse at the end of every period of Tp. In other words, the discriminator 20b generates a negative pulse every time the select signal remains at the "1" level for the time Tp. The holder 20c starts holding the data upon receipt of each negative pulse and holds the data until the peak-detection sync signal rises to the high level again. The output device 20d generates an effective-data flag or an ineffective-data flag in accordance with the level at which the output data of the holder 20c stays at each leading edge of the sample-and-hold control signal.

The time Tp is a time constant which the peak hold circuit 12 requires to accomplish correct peak-holding operation.

Sixth Embodiment

All embodiments described above are spectrum analyzers of the type which display the frequency spectrum of an object signal in a single channel. By contrast, the sixth embodiment is an ASSA which displays the frequency spectrum of a sample signal in two channels. This ASSA will be described with reference to FIG. 16.

Figure 16:
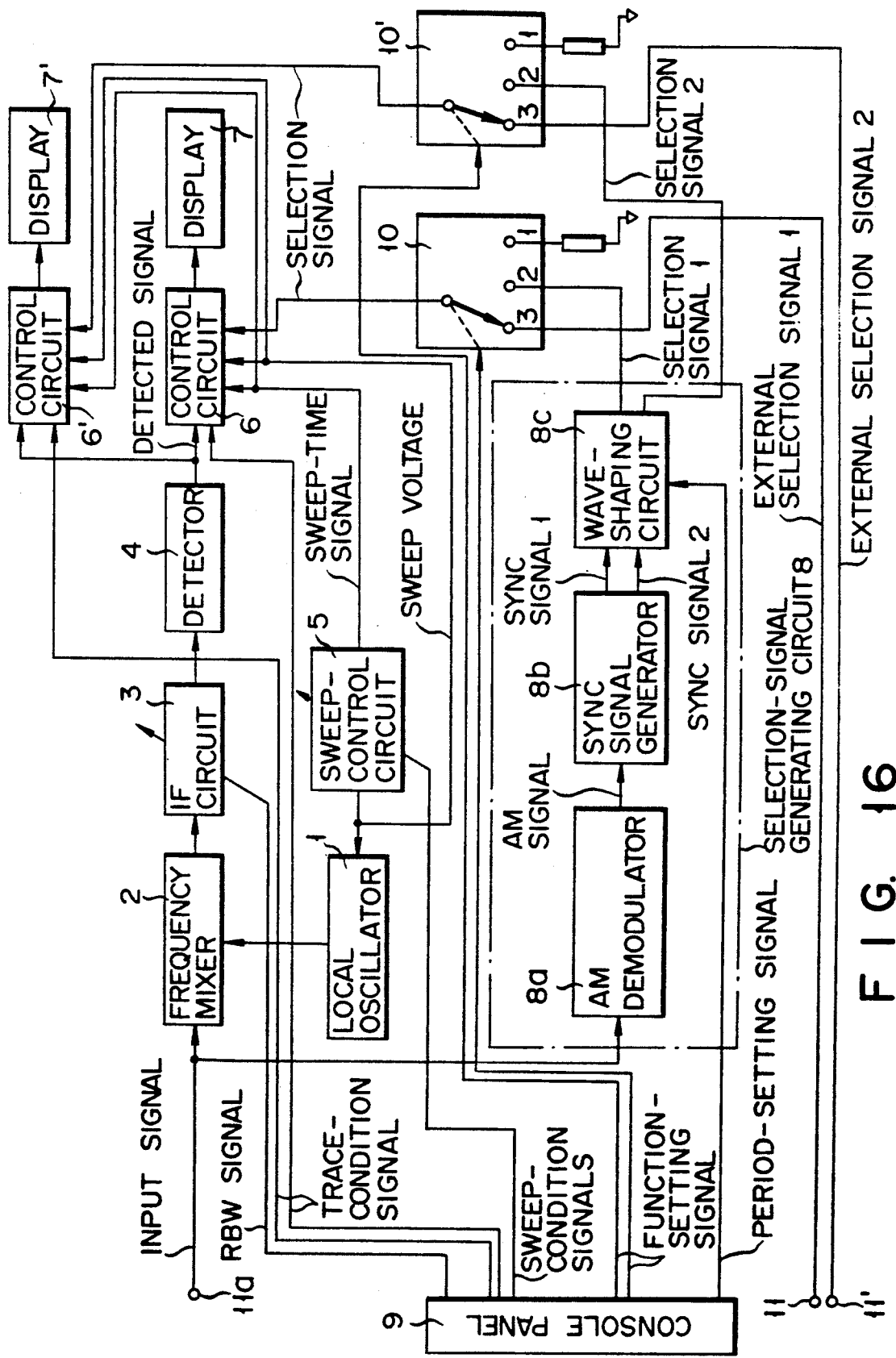
FIG. 16 is a block diagram showing a sixth embodiment of the present invention, which is an analog-storage spectrum analyzer.

As is understood from FIG. 16, the sixth embodiment is a combination of the first embodiment (ASSA) shown in FIG. 1, a control circuit 6', a display 7', and a switching device 10'. Therefore, the ASSA of the sixth embodiment can display the frequency spectra of two portions of an object signal, which have been designated by a first selection signal 1 and a second selection signal 2. Obviously, the sixth embodiment is more efficient than the first to fifth embodiments which display the frequency spectrum of only one part of the object signal. The sixth embodiment can be modified such that a two-phenomena display displays the frequency spectra of two desired portions of the object signal.

Seventh Embodiment

The seventh embodiment is a DSSA which displays the frequency spectrum of a sample signal in two channels. As is evident from FIG. 17, the seventh embodiment is a combination of the fifth embodiment (DSSA) shown in FIG. 8A, a selection-signal generating circuit 8', a switching device 10', an effective-data detection circuit 15', a data control circuit 16', a data memory 6b', and a display 7'. Like the sixth embodiment (FIG. 16), the seventh embodiment can display the frequency spectra of two portions of an object signal, which have been designated by a first selection signal 1 and a second selection signal 2. Obviously, the seventh embodiment is more efficient than the first to fifth embodiments which display the frequency spectrum of only one part of a sample signal. The seventh embodiment can be modified such that a two-phenomena display displays the frequency spectra of two desired portions of a sample signal.

Eighth Embodiment

The eighth embodiment of the invention, which is a DSSA, will be described with reference to FIG. 18. As can be understood from FIG. 18, the eighth embodiment is identical to the fourth embodiment (FIG. 8A), except for three respects. First, it has no components equivalent to the effective-data detecting circuit 15 and the data control circuit 16. Second, a switch 21 is connected between a detector 4 and a peak hold circuit 12. Third, a maximum value-holding control circuit 26 is connected between an A/D converter 6a and a data memory 6b. The switch 21 is closed in response to the selection signal supplied from a switching device 10, thus connecting the detector 4 to the peak hold circuit 12. Therefore, the peak hold circuit 12 detects and holds the peak value of valid data since the circuit 12 is set to a minimum level immediately before the peak of every sample signal is detected. The peak value thus detected and held is supplied from the circuit 12 via a sample-and-hold circuit 13 to the A/D converter 6a. The A/D converter 6a converts the peak value into digital data. The digital data representing the peak value is stored into the data memory 6b through the maximum value-holding control circuit 26, read out from the data memory 6b, and displayed by a display 7. On the other hand, while the switch 21 is opened, the display 7 displays the minimum value of the valid data. Therefore, as the object signal is frequency swept, the maximum (peak) value of the signal is updated and stored in the data memory 6b, whereby the frequency spectrum shown in FIG. 19 becomes more continuous as is illustrated in FIG. 20. Due to the use of the switch 21 and the maximum value-holding control circuit 26, the eighth embodiment accomplishes the same advantages as the fourth embodiment (FIG. 8A).

As has been described, according to the present invention, the entire waveform of an object signal is continuously swept thus detecting the frequency spectrum of the signal, and any desired part of the spectrum is selected. The spectrum analyzer according to the invention, therefore, allows for the analysis of a desired portion of a BURST signal such as a burst signal, without imposing an excessive load on the local oscillator or the detector for detecting the spectrum and, hence, without an efficiency deterioration.

The digital circuit for selecting the desired part of the spectrum is simple in structure, and can be operated by simple software.

Moreover, since the object signal is swept continuously, the actual sweep time can be correctly measured and displayed. This enables the operator of the spectrum analyzer to set the analysis condition correctly.

What is claimed is:

1. A spectrum analyzer comprising:
   high-frequency signal processing means for frequency-converting a signal to be measured including measurement object waves recurring for a short period of time, into an intermediate-frequency signal, by using a local oscillation signal swept continuously over a desired range of frequencies, and thereby outputting a frequency spectrum of the signal to be measured;

detector means for detecting the frequency spectrum output by said high-frequency signal processing means;

selection signal supplying means for supplying a selection signal representing a desired portion of the spectrum in which lies the measurement object waves, said selection signal supplying means having at least one of means for internally supplying the selection signal and means for externally supplying the selection signal;

A/D converting means for converting the frequency spectrum detected by said detector means, into digital spectrum data;

control means for outputting a portion of the digital spectrum data output by said A/D converting means corresponding to said desired portion of the spectrum in which lies the measurement object waves, in accordance with the selection signal supplied by the selection signal supplying means;

memory means for storing the spectrum data output by said control means; and sweep control means for causing the high-frequency signal processing means to sweep the local oscillation signal repeatedly, each time for a period other than an integral multiple of the cycle period of the selection signal.

2. The spectrum analyzer according to claim 1, wherein said sweep control means includes:
a counter for counting the selection signal;
a calculating section for calculating a number of sweep times that said-high-frequency signal processing means sweeps the local oscillation signal and a sweep time period for which said high-frequency signal processing means sweeps the local oscillation signal, in accordance with a signal output by said counter and in accordance with sweep-condition setting signals; and
a sweep signal generator for generating a voltage for sweeping the local oscillation signal, in accordance with the number of sweep times and the sweep time period calculated by said calculating section.

3. The spectrum analyzer according to claim 1, wherein said selection signal supplying means includes a selection signal generating circuit for internally generating the selection signal representing said desired portion of the spectrum in accordance with the signal to be measured.

4. The spectrum analyzer according to claim 3, wherein said selection signal generating circuit includes:
an AM demodulator for demodulating the amplitude of the signal to be measured;
a sync signal generating circuit for comparing an AM-demodulated signal output from said AM demodulator with a reference voltage, thereby to generate sync signals representing periods during which the signal to be measured has predetermined frequencies; and
selection means for selecting the sync signals generated by said sync signal generating circuit, in accordance with a period-setting signal.

5. The spectrum analyzer according to claim 4, wherein said selection means includes means for substantially compensating for transiently responding signals in said high-frequency signal processing means and said detector means.

6. The spectrum analyzer according to claim 1, wherein said selection signal supplying means includes means for receiving the selection signal generated by an external equipment.

* * * * *